US008952499B2

(12) United States Patent
Morimoto et al.

(10) Patent No.: US 8,952,499 B2
(45) Date of Patent: Feb. 10, 2015

(54) INTEGRATED CIRCUIT

(75) Inventors: Takashi Morimoto, Osaka (JP);
Takashi Hashimoto, Fukuoka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 13/641,266

(22) PCT Filed: Oct. 26, 2011

(86) PCT No.: PCT/JP2011/005976
§ 371 (c)(1),
(2), (4) Date: Oct. 15, 2012

(87) PCT Pub. No.: WO2012/114400
PCT Pub. Date: Aug. 30, 2012

(65) Prior Publication Data
US 2013/0033303 A1 Feb. 7, 2013

(30) Foreign Application Priority Data
Feb. 21, 2011 (JP) ................. 2011-034158

(51) Int. Cl.
*H01L 27/06* (2006.01)
*H01L 23/34* (2006.01)
(Continued)

(52) U.S. Cl.
CPC .......... *H01L 27/0629* (2013.01); *H01L 23/345* (2013.01); *H01L 29/7833* (2013.01); *H01L 23/5228* (2013.01); *H01L 2924/0002* (2013.01)
USPC ............ 257/621; 257/E23.174; 257/E21.597; 438/485; 438/202

(58) Field of Classification Search
CPC ............ H01L 21/6835; H01L 21/76802; H01L 23/481; H01L 24/02; H01L 25/0657; H01L 25/50; H01L 21/76898; H01L 21/823475; H01L 21/823481; H01L 21/12
USPC .......... 257/621, E23.174, E21.597, 369, 257/E21.54, E27.046; 438/430, 667; 219/485, 202, 206, 509, 203, 543, 209
See application file for complete search history.

(56) References Cited

U.S. PATENT DOCUMENTS 5,321,231 A * 6/1994 Schmalzriedt et al. ....... 219/497
5,517,132 A 5/1996 Ohara
(Continued)

FOREIGN PATENT DOCUMENTS

JP 62-156850 7/1987
JP 63-9960 1/1988
(Continued)

OTHER PUBLICATIONS

International Search Report issued Jan. 17, 2012 in International (PCT) Application No. PCT/JP2011/005976.
(Continued)

*Primary Examiner* — David Vu
*Assistant Examiner* — Mouloucoulaye Inoussa
(74) *Attorney, Agent, or Firm* — Wenderoth, Lind & Ponack, L.L.P.

(57) ABSTRACT

An integrated circuit is provided with a substrate, an electrode, two diffusion areas, and a resistance heater. The substrate includes a first surface and second surface that are substantially parallel to each other. The electrode is laminated onto the first surface. The two diffusion areas are disposed within the substrate in the vicinity of the electrode to form one transistor with the electrode. The resistance heater is located on an area of the second surface across the substrate from the electrode. The resistance heater produces heat by allowing electric current to flow.

24 Claims, 23 Drawing Sheets

(51) Int. Cl.
*H01L 29/78* (2006.01)
*H01L 23/522* (2006.01)

(56) References Cited

U.S. PATENT DOCUMENTS

| | | | |
|---|---|---|---|
| 6,114,674 A * | 9/2000 | Baugh et al. | 219/543 |
| RE37,475 E | 12/2001 | Ohara | |
| RE38,152 E | 6/2003 | Ohara | |
| 2005/0270049 A1 | 12/2005 | Kishishita | |
| 2006/0112360 A1 | 5/2006 | Okudaira | |
| 2006/0170111 A1* | 8/2006 | Isa et al. | 257/775 |
| 2006/0263913 A1 | 11/2006 | Marshall | |
| 2006/0278950 A1 | 12/2006 | Tai | |
| 2008/0114568 A1 | 5/2008 | Marshall | |
| 2009/0016408 A1 | 1/2009 | Doan et al. | |
| 2010/0032764 A1* | 2/2010 | Andry et al. | 257/369 |
| 2010/0032811 A1* | 2/2010 | Ding et al. | 257/621 |
| 2010/0060193 A1 | 3/2010 | Muehlschlegel | |
| 2011/0035716 A1 | 2/2011 | Hino et al. | |

FOREIGN PATENT DOCUMENTS

| | | |
|---|---|---|
| JP | 7-249067 | 9/1995 |
| JP | 2001-345420 | 12/2001 |
| JP | 2004-6473 | 1/2004 |
| JP | 2005-347487 | 12/2005 |
| JP | 2006-146601 | 6/2006 |
| JP | 2006-351628 | 12/2006 |
| JP | 2008-541492 | 11/2008 |
| JP | 2009-21587 | 1/2009 |
| JP | 2010-67974 | 3/2010 |
| JP | 2011-34489 | 2/2011 |
| WO | 2006/127745 | 11/2006 |

OTHER PUBLICATIONS

Atsushi Iwata, The Basics of CMOS Integrated Circuits Sections 2.2.3-2.2.4, pp. 22-26, Sep. 15, 2000 (along with partial English translation and Verification of Translation).

* cited by examiner

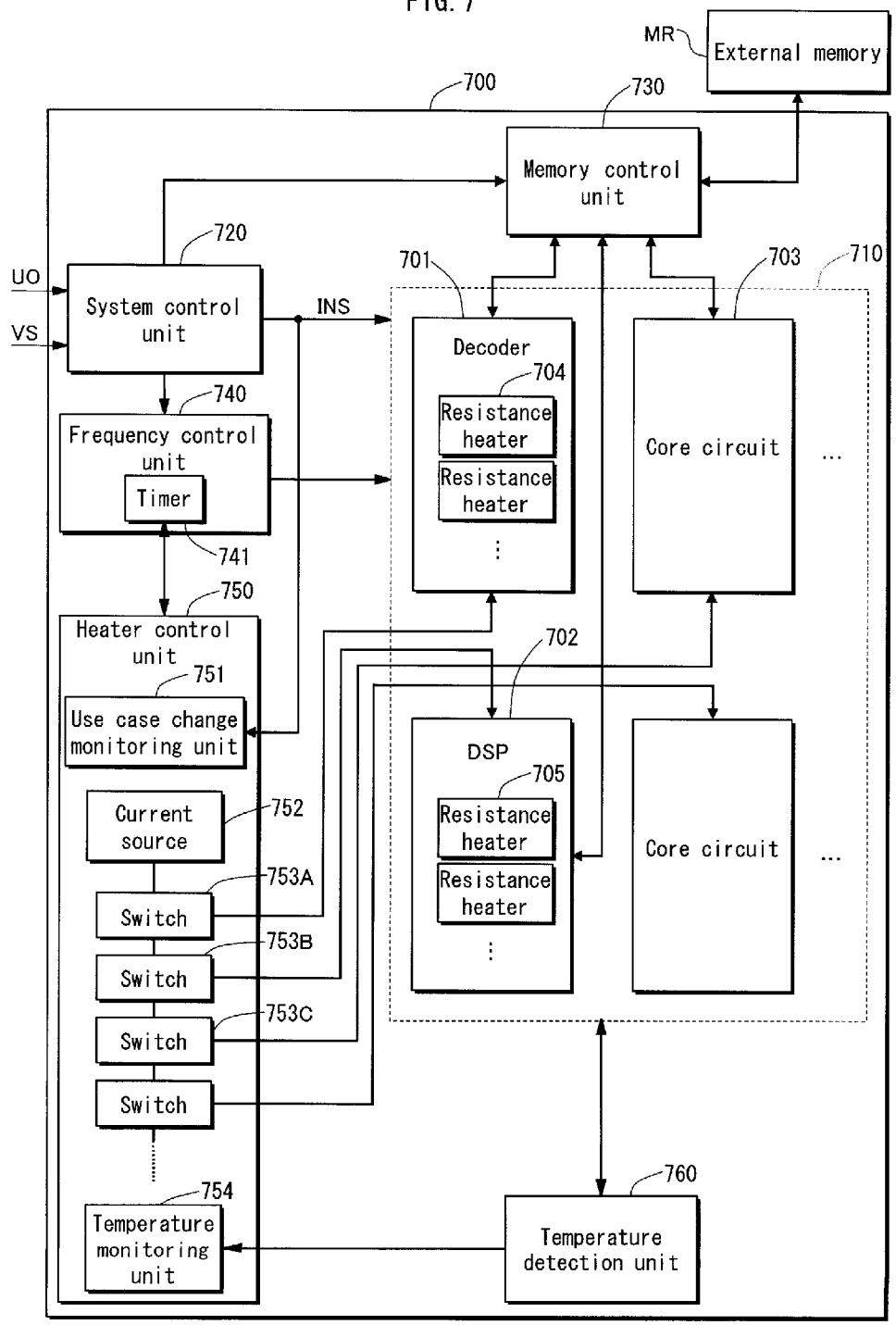

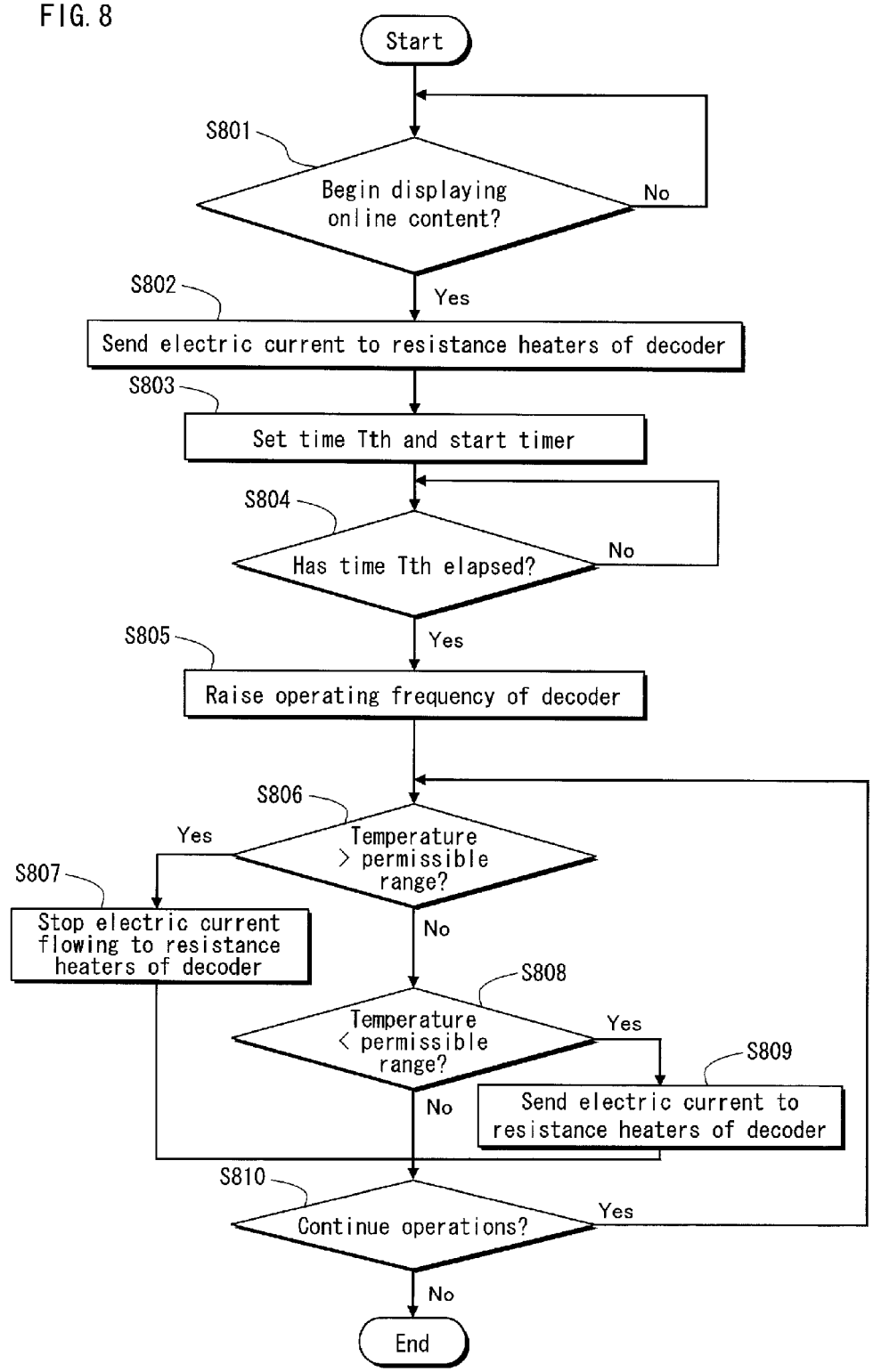

CMP

CMP

CMP

INTEGRATED CIRCUIT

TECHNICAL FIELD

The present invention relates to technology for controlling semiconductor integrated circuit operating speeds, and in particular to technology for improving transistor operating speeds.

BACKGROUND ART

Regarding methods for raising the operating speed of semiconductor integrated circuits, there are many options, for example by devising ways of implementing a circuit, by changing circuit architecture, etc., Any of the methods address the most fundamental issue of improving transistor operating speeds. By doing so, the speed of any kind of circuit may be improved.

Raising the transistor power supply voltage, or lowering the transistor threshold voltage are both known methods for improving the operating speed of transistors. For example, Non-Patent Literature 1 describes formulae which show the rise time and fall time of a signal outputted by a CMOS integrated circuit. As is made evident by these formulae, transistors operate faster when their power supply voltages are higher or their threshold voltages are lower.

The method disclosed in Patent Literature 1 is a known example among methods for controlling transistor operating speeds by adjusting transistor power supply voltages. With this method, power supply voltages are adjusted individually for combined circuits separated by a plurality of flip-flops. Especially in a combined circuit which includes a critical path, the power supply voltage of every logic element is kept high. Due to this, the operation speed of the combined circuit increases. Here, "critical path" refers to a pathway in a circuit that needs the most amount of time to transmit a signal, or to an important pathway that must absolutely transmit a signal within a provided time. In the method described in Patent Literature 1, a power supply system is established individually for each combined circuit, and therefore the number of power supply systems is great. However, since it is possible to regulate a power supply voltage individually in each combined circuit, power supply voltages can be kept low for combined circuits with a small number of logic stages and lenient speed restrictions. As a result, not only the operating speed of a combined circuit which includes a critical path can be kept at a high level, but also the electric power consumption of the entire circuit can be suppressed.

DVFS (Dynamic Voltage and Frequency Scaling) and AVS (Adaptive Voltage Scaling) are other known technologies. With these technologies, the power supply voltage of a circuit is dynamically adjusted in keeping with operating frequency fluctuations. Specifically, when slow circuit operations are acceptable, the operating frequency is kept at a usual level, and accordingly, the power supply voltage also is kept at a usual level. Alternatively, when fast circuit operations are necessary, the operating frequency is set higher than the usual level, and accordingly, the power supply voltage is adjusted higher than the usual level. In this way, these technologies achieve both an improvement in operating speeds and a reduction in electric power consumption.

The method disclosed in Patent Literature 2 is a known example of a method for controlling transistor operating speeds by adjusting transistor threshold voltages. With this method, transistor threshold voltages are adjusted by heating transistors. Specifically, a heater is provided next to an analog circuit such as a differential amplifier, and the amount of heat produced by the heater is adjusted in accordance with the environmental temperature. Here, when the temperature of a transistor is higher, the threshold voltage of the transistor is lower. When the environmental temperature falls, the heater heats the analog circuit to prevent transistors included in the analog circuit from cooling down. By doing so, the threshold voltages of the transistors are kept low, and their operation speeds kept high. In this way, even at low temperatures, the analog circuit operates stably. Changing the bias voltage of a transistor is another known method for controlling transistor operating speeds by adjusting transistor threshold voltages.

Furthermore, known technology exists for a design to lower the threshold voltages of those transistors which are desired to have high operating speeds. For example, in the semiconductor integrated circuit layout design method disclosed in Patent Literature 3, a library (Hvt Cell Library) made up of transistors with high threshold voltages (Hvt cell), and a library (Lvt Cell Library) made up of transistors with low threshold voltages (Lvt cell) are used together. Specifically, first a netlist which uses only the Lvt cell library is created, or a netlist having a portion thereof forcibly replaced with the Hvt cell library is created. Next, layout data is created in accordance with the netlist. Delay time is then calculated for every pathway included in the layout data. If timing errors are detected in the results of the calculation, then cell resizing, buffer insertion, or cell replacement is performed, after which the delay time of each pathway is calculated again. This operation is repeated until no more timing errors are detected. As a result, transistors placed on a critical path will be made of Lvt cells, and all other transistors will be made of Hvt cells. In other words, transistors that ought to operate at high speeds will have low threshold voltages despite electric power consumptions being high, and transistors which may acceptably run at slow speeds will have low electric power consumptions despite the threshold voltages being high. In this way, with the electric power consumption of the entire circuit being kept low, the transistors placed on the critical path will run at high speeds.

CITATION LIST

Patent Literature

[Patent Literature 1]
Japanese Patent Application Publication No. H7-249067
[Patent Literature 2]
Japanese Patent Application Publication No. 2001-345420
[Patent Literature 3]
Japanese Patent Application Publication No. 2006-146601

Non-Patent Literature

[Non-Patent Literature 1]
Atsushi Iwata, "CMOS Shuseki-Kairo no Kiso," (in Japanese) Kagaku Gijutsu Shuppan

SUMMARY OF INVENTION

Technical Problem

With the demand for power conservation, power supply voltages have been reduced in integrated circuits of recent years. In particular, along with the further miniaturization of circuit elements and traces, static electric power consumption, namely, electric power consumption caused by leakage current, is growing. Due to the fact that the leakage current increases in proportion to a power supply voltage, greatly raising the power supply voltage is not desirable. Also, dynamic electric power consumption, namely, electric power necessary for switching operation of a transistor, is proportional to the power supply voltage squared. Accordingly, for controlling transistor operating speeds while electric power consumption is kept low, there is a need for technology that dynamically adjusts not just power supply voltages, but transistor threshold voltages as well.

However, the method described in Patent Literature 3 determines the threshold voltage of each individual transistor at the design stage, so it is not possible to dynamically adjust transistor threshold voltages. Alternatively, even though the method described in Patent Literature 2 can keep the temperature of the entire analog circuit constant despite a decrease in environmental temperature, it would be difficult to go as far as to control the temperature of each individual transistor to dynamically adjust its threshold voltage.

It is an aim of the present invention to solve the above problems, and in particular to provide an integrated circuit that reliably raises the operating speeds of transistors by dynamically adjusting the threshold voltages of the transistors while keeping electric power consumption low.

Solution to Problem

An integrated circuit according to one aspect of the present invention is an integrated circuit comprising a substrate, an electrode, two diffusion areas, and a resistance heater. The substrate includes a first surface and a second surface that are substantially parallel to each other. The electrode is laminated onto the first surface of the substrate. The two diffusion areas are disposed within the substrate in the vicinity of an electrode to form one transistor with the electrode. The resistance heater is located on an area of the second surface across the substrate from the electrode. The resistance heater is configured to produce heat by allowing electric current to flow.

In another aspect of the present invention, an integrated circuit comprises a first substrate, an electrode, two diffusion areas, a second substrate and a resistance heater. The first substrate includes a first surface and a second surface that are substantially parallel to each other. The electrode is laminated onto the first surface of the first substrate. The two diffusion areas are disposed within the first substrate in the vicinity of an electrode to form one transistor with the electrode. The second substrate is bonded to the second surface of the first substrate. The resistance heater is located on an area of the second substrate opposite to an area of the second surface across the first substrate from the electrode. The resistance heater is configured to produce heat by allowing electric current to flow.

Advantageous Effects of Invention

Both integrated circuits of the present invention use a resistance heater to heat the transistors. By doing so, the integrated circuits can individually control the temperatures of the transistors to dynamically adjust the threshold voltages thereof. In this way, the integrated circuits can reliably raise the operating speeds of the transistors higher whilst keeping electric power consumption low.

BRIEF DESCRIPTION OF DRAWINGS

FIG. 7 is a block diagram of an integrated circuit 700 of Embodiment 1 of the present invention;

FIG. 8 is a flow chart for a situation where the integrated circuit 700 of Embodiment 1 of the present invention controls the operating speed of each core circuit;

DESCRIPTION OF EMBODIMENTS

Embodiments of the present invention are described below with reference to the drawings.

Embodiment 1

Transistor Structure

Figure 1:
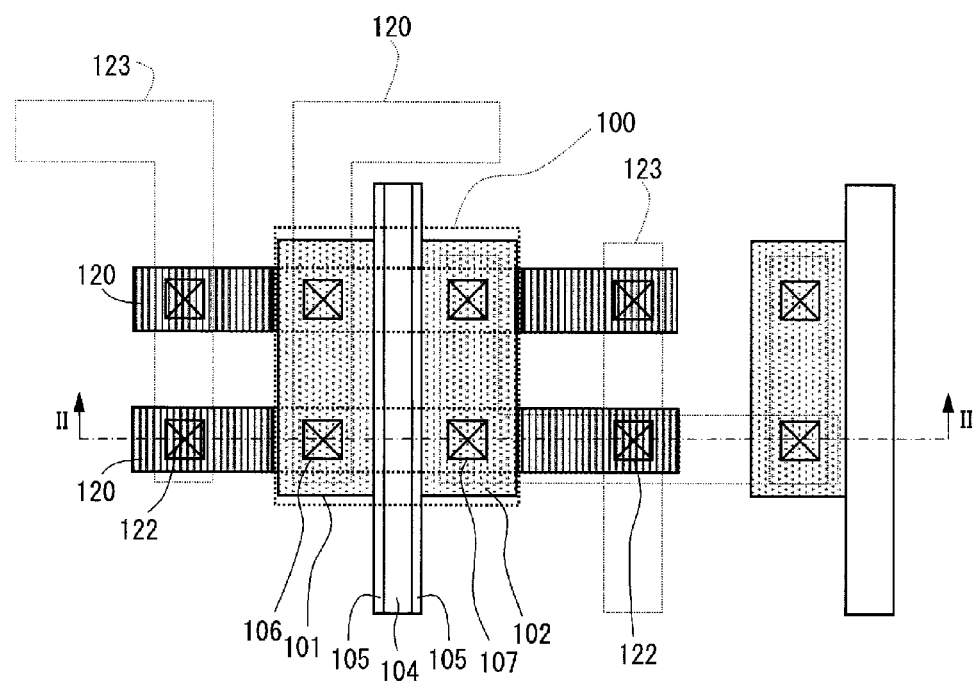
FIG. 1 is a layout diagram of a transistor and its surroundings included in an integrated circuit of Embodiment 1 of the present invention.
Figure 2:
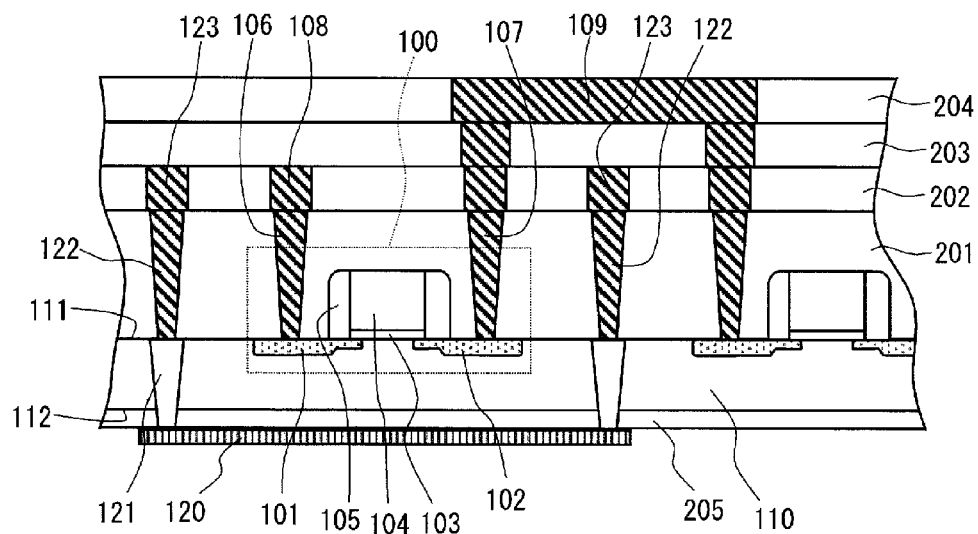
FIG. 2 is a cross-sectional diagram taken along the line II-II shown in FIG. 1.

FIG. 1 is a layout diagram of a transistor and its surroundings included in an integrated circuit of Embodiment 1 of the present invention. FIG. 2 shows a cross section taken along the line II-II shown in FIG. 1. A transistor 100 is a MOS (Metal Oxide Semiconductor) transistor. A distinguishing feature of the structure shown in FIGS. 1 and 2 is that a resistance heater 120 is placed across a substrate 110 from its surface area where the transistor 100 is laminated.

Referring to FIG. 2, the substrate 110 includes a first surface 111 and second surface 112 (the upper surface and lower surface respectively, in FIG. 2) that are substantially parallel to each other. The transistor 100 is laminated to the first surface 111 and includes a first diffusion area 101, a second diffusion area 102, a gate oxide film 103, a gate electrode 104, sidewalls 105, a first contact hole 106, a second contact hole 107, a first trace 108 and a second trace 109. The substrate 110 is formed of silicon (Si). The first diffusion area 101 and second diffusion area 102 are impurity-ion-doped areas in the first surface 111 of the substrate 110. One of the diffusion areas is used as a drain and the other as a source. When the transistor 100 is an N type, donor impurities such as phosphor (P) are doped, and when the transistor 100 is a P type, acceptor impurities such as boron (B) are doped. As shown in FIG. 1, the diffusion areas 101 and 102 are rectangle-shaped, and as shown in FIG. 2, a gap exists between them. This gap is covered by the gate oxide film 103. The gate oxide film 103 is formed of silicon oxide ($SiO_2$) or high-dielectric constant (High-k) material. The gate electrode 104 is positioned on top of the gate oxide film 103, which electrically separates the gate electrode 104 from the diffusion areas 101 and 102. The gate electrode 104 is formed of polysilicon or metal material. As shown in FIG. 1, the gate electrode 104 extends between the first diffusion area 101 and the second diffusion area 102, and is connected to an external power source (not shown in FIGS. 1 and 2). Referring to FIG. 2, the sidewalls 105 cover the sides of the gate oxide film 103 and the gate electrode 104, and in particular electrically separate the gate electrode 104 from the diffusion areas 101 and 102. The sidewalls 105 are formed of silicon nitride ($Si_3N_4$). The first diffusion area 101, the second diffusion area 102, the gate oxide film 103, the gate electrode 104, and the sidewalls 105 are covered by interlayer insulating films 201, 202, 203 and 204. The interlayer insulating films 201-204 are formed of silicon oxide or low-dielectric constant (Low-k) material. The first contact hole 106 exposes the first diffusion area 101, and the second contact hole 107 exposes the second diffusion area 102. The first trace 108 is connected to the first diffusion area 101 through the first contact hole 106, and the second trace 109 is connected to the second diffusion area 102 through the second contact hole 107. Note that in FIG. 1, the traces 108 and 109 are shown by dotted lines. The first trace 108 and the second trace 109 are made of aluminium or copper. One of them is used as a drain electrode and the other one is used as a source electrode.

Referring further to FIG. 2, the second surface 112 of the substrate 110 is covered with an insulating film 205. The insulating film 205 is formed of silicon oxide. The resistance heater 120 is laminated to a part of the insulating film 205 covering the second surface 112. The part is positioned underneath the transistor 100. The resistance heater 120 is formed of polysilicon or non-doped silicon with high sheet resistance. As shown in FIG. 1, the resistance heater 120 has a long, thin rectangular form which extends in a direction perpendicular to the gate electrode 104. Furthermore, two resistance heaters 120 are provided to one transistor 100. As shown in FIG. 2, one TSV (Through-Silicon Via) 121 is formed on a part of the substrate 110 facing each longitudinal end of the resistance heater 120. The TSVs 121 are filled with polysilicon. At the first surface 111 of the substrate 110, the end of the TSV 121 is exposed by a third contact hole 122. A third trace 123 is connected to the TSV 121 through the third contact hole 122. The third trace 123 is formed of aluminium or copper. Note that in FIG. 1, the third trace 123 is shown by dotted lines. Because the resistance value of the resistance heater 120 is greater than that of the third trace 123, a comparatively great Joule heat arises when electric current flows to the resistance heaters 120 by way of the third trace 123. In this way, it is possible to heat the transistor 100, in particular its channel area, by using the resistance heaters 120.

Figure 3:
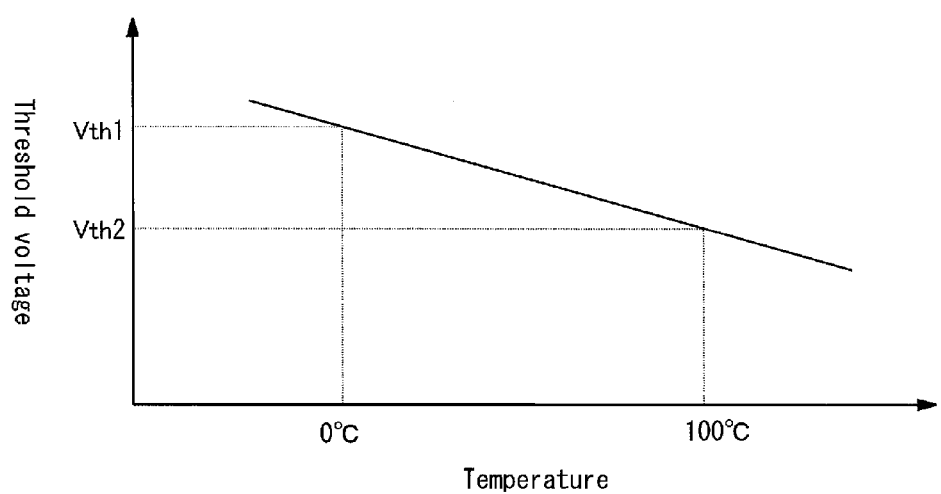
FIG. 3 is a graph which shows the relationship between the threshold voltage and channel area temperature of a typical MOS transistor.

The resistance heaters 120 are placed underneath those transistors 100 which belong to a critical path. This enables those transistors to be selectively heated so that their temperatures rise higher than those of other transistors. Here, generally speaking, transistors under a high temperature condition have lower threshold voltages than transistors under a low temperature condition. FIG. 3 is a graph which shows the relationship between the threshold voltage and channel area temperature of a typical MOS transistor. Referring to FIG. 3, the threshold voltage falls roughly in proportion to the rising of the channel area temperature. For example, the threshold voltage Vth2 at 100 degrees Celsius is lower than the threshold voltage Vth1 at 0 degrees Celsius. (Both threshold voltages Vth1 and Vth2 are around 1V-3V.) Due to this characteristic, raising the temperature of transistors on a critical path higher than the temperature of other transistors enables the transistors on the critical path to operate at faster speeds than the other transistors even though all the transistors share a common power supply voltage. Furthermore, by allowing electric current to flow to the resistance heaters only during the time period when high speed operation is necessary, it is possible to suppress the increase of electric power consumption to the minimum requirement. In this way, by using the structure shown in FIGS. 1 and 2, it is possible to dynamically adjust the transistor threshold voltages. Note that a detailed description of the adjustment method will be described later.

Transistor Laminating Process

FIGS. 4-6 show the laminating process of the structure shown in FIGS. 1 and 2. All transistors included in the integrated circuit of Embodiment 1 of the present invention have been laminated with a similar process.

Figure 4A:
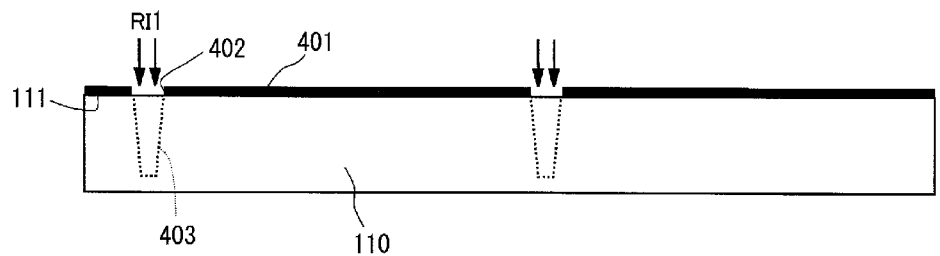
FIG. 4A is a cross-sectional diagram showing the process of forming TSVs 121 in a substrate 110.

FIG. 4A is a cross-sectional diagram showing the process of forming the TSVs 121 in the substrate 110. First, the first surface 111 of the substrate 110 is covered with a photoresist 401, which is exposed to light in the pattern of the TSVs 121. As a result, parts of the photoresist are removed from the areas where the TSVs 121 are to be formed, and then holes 402 appear. Next, using the remaining photoresist 401 as a mask, RIE (Reactive Ion Etching) is performed to remove parts of the substrate 110 which are exposed vias the holes 402 of the photoresist and then form vias 403 (Refer to the dotted line sections of FIG. 4A). The arrows RI1 shown in FIG. 4A indicate ion current used in the RIE. Following that, after the photoresist 401 are removed from the entirety of the first surface 111, an insulating film is formed by using CVD (Chemical Vapor Deposition) to coat the inner surfaces of the vias 403 with silicon oxide. Subsequently, CVD is further used to fill the vias 403 with polysilicon. At this point, polysilicon will be protruding out from the upper ends of the vias 403. Accordingly, after the vias 403 are filled with polysilicon, the first surface 111 is polished with CMP (Chemical Mechanical Polish), which removes the polysilicon protruding from the upper ends of the vias 403 to flatten the first surface 111. In this way, the TSVs 121 are formed.

Figure 4B:
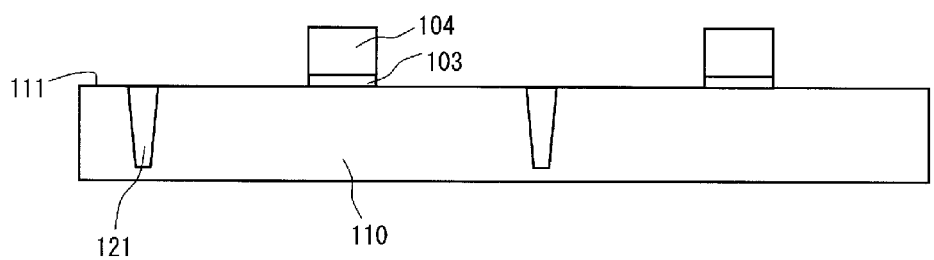
FIG. 4B is a cross-sectional diagram showing the process of laminating gate oxide films 103 and gate electrodes 103 onto a first surface 111 of the substrate 110.

FIG. 4B is a cross-sectional diagram showing the process of laminating the gate oxide films 103 and gate electrodes 104 onto the first surface 111 of the substrate 110. After the TSVs 121 are formed, first the entirety of the first surface 111 is thermally oxidized to be covered with a layer of silicon oxide. Next, polysilicon is accumulated on the entirety of the silicon oxide layer by LPCVD (Low Pressure CVD). Following that, the entirety of this polysilicon layer is coated with a photoresist and exposed to light in the pattern of the gate electrodes 104. With this, the photoresist is removed from all but the areas where the gate electrodes 104 are to be formed. Next, using the remaining photoresist as a mask, RIE is performed to remove the superfluous silicon oxide and polysilicon from the first surface 111, and then form the gate oxide films 103 and the gate electrodes 104. Finally, the remaining photoresist is removed.

Figure 4C:
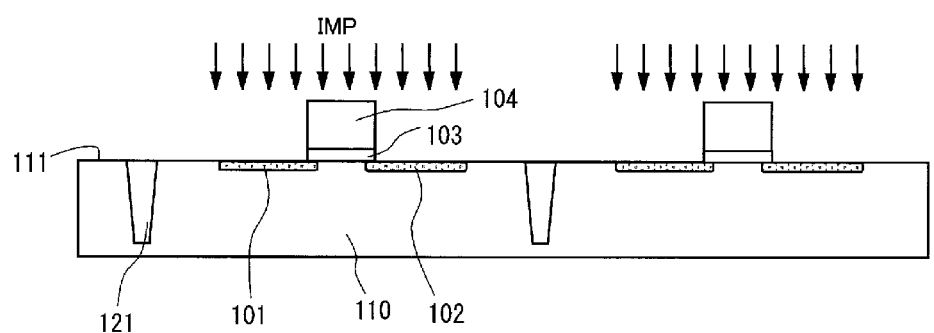
FIG. 4C is a cross-sectional diagram showing the process of forming diffusion areas.

FIG. 4C is a cross-sectional diagram showing the process of forming the diffusion areas. With this process, the gate electrodes 104 are used as a mask, and impurity ions such as boron or phosphor are infused into the first surface 111 of the substrate 110. The arrows IMP shown in FIG. 4C indicate the infusion ion current. In this way, the diffusion areas 101 and 102 are thinly formed on either side of each of the gate electrodes 104.

Figure 5A:
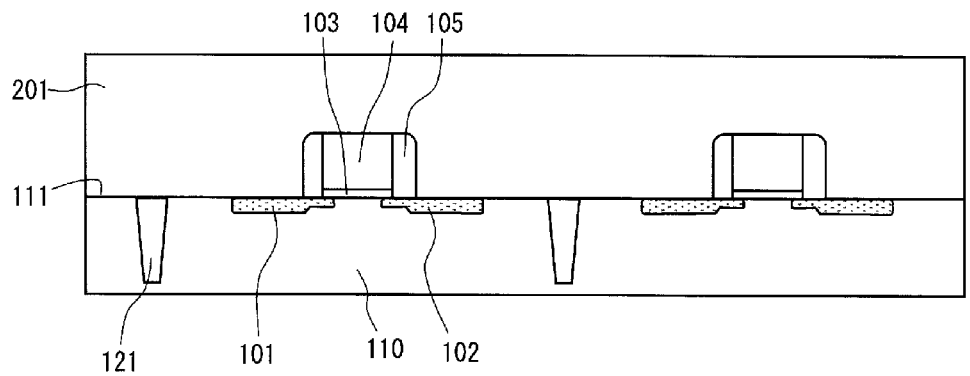
FIG. 5A is a cross-sectional diagram showing the process of forming sidewalls 105 and an interlayer insulating film 201.

FIG. 5A is a cross-sectional diagram showing the process of forming the sidewalls 105 and the interlayer insulating film 201. After the diffusion areas 101 and 102 are formed, first the entirety of the first surface 111 of the substrate 110 is covered with a layer of silicon nitride by LPCVD. Next, anisotropic etching is performed so that the silicon nitride layer remains only on the sides of the gate oxide films 103 and the gate electrodes 104. By doing so, the sidewalls 105 are formed. Following that, using the gate electrodes 104 and the sidewalls 105 as a mask, impurity ions such as boron or phosphor are additionally infused into the first surface 111. As a result, the thickness of the diffusion areas 101 and 102 increases on the outer sides of the sidewalls 105. In this way, the sidewalls 105 function as a spacer to reliably separate the diffusion areas 101 and 102 from the gate electrode 104. After the impurity ions are infused, the entirety of the first surface 111 is covered with a silicon oxide coating to form the interlayer insulating film 201.

Figure 5B:
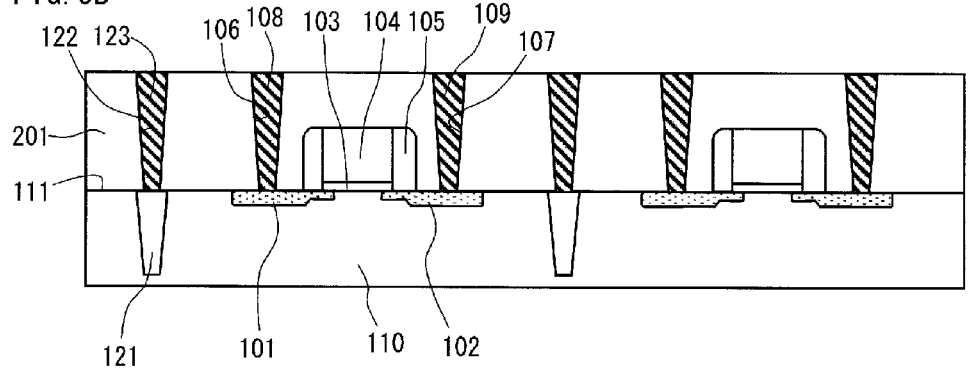
FIG. 5B is a cross-sectional diagram showing the process of forming contact holes 106, 107 and 122 in the interlayer insulating film 201.

FIG. 5B is a cross-sectional diagram showing the process of forming the contact holes 106, 107 and 122 in the interlayer insulating film 201. First, the entirety of the interlayer insulating film 201 is covered with a photoresist, and exposed to light in the pattern of the contact holes 106, 107 and 122. By doing so, parts of the photoresist are removed from the areas where the contact holes 106, 107 and 122 should be formed, and then holes appear. Next, using the remaining photoresist as a mask, RIE is performed to remove parts of the interlayer insulating film 201 which are exposed through the holes of the photoresist and then deepen the holes. Following that, CVD is used to fill the insides of the holes with aluminium, tungsten, or copper. At this point, the metal will be protruding out from the upper ends of the holes. Accordingly, after the holes are filled with the metal, the surface of the interlayer insulating film 201 is polished with CMP, which removes the metal protruding from the upper ends of the holes to flatten the surface of the interlayer insulating film 201. In this way, the contact holes 106, 107 and 122 are formed.

Figure 5C:
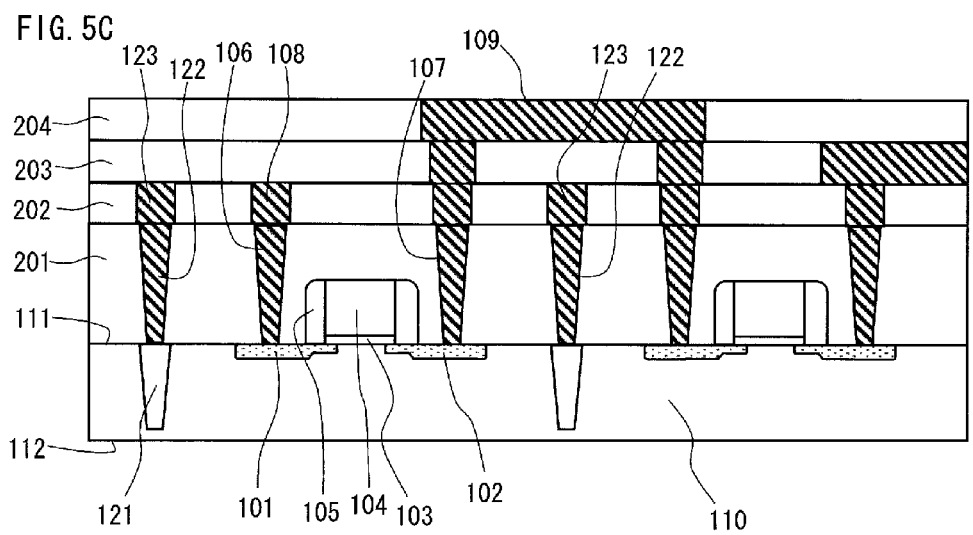
FIG. 5C is a cross-sectional diagram showing the process of forming multilayer traces 108, 109 and 123.

FIG. 5C is a cross-sectional diagram which shows the process of forming multilayer traces 108, 109 and 123. First, the entirety of the interlayer insulating film 201 is covered with a silicon oxide layer 202 by CVD. Next, the entirety of the silicon oxide layer 202 is covered with a photoresist, and is exposed to light in the pattern of the traces 108, 109 and 123 as indicated by the dotted lines shown in FIG. 1. By doing so, parts of the photoresist are removed from the areas where the traces 108, 109 and 123 should be formed, and then holes appear. Next, using the remaining photoresist as a mask, RIE is performed to remove the parts of the silicon oxide layer 202 which are exposed vias the holes of the photoresist and then deepen the holes. Following that, plating or spattering is used to fill the insides of the holes with aluminium or copper. At this point, the metal will be protruding out from the upper ends of the holes. Accordingly, after the holes are filled with the metal, the surface of the silicon oxide layer 202 is polished with CMP, which removes the metal protruding from the upper ends of the holes to flatten the surface of the silicon oxide layer 202. By doing so, the traces 108, 109 and 123 within the silicon oxide layer 202 are formed. After that, each time one of the silicon oxide layers 203 and 204 are newly laminated, a similar process is repeated. In this way, the multilayer traces shown in FIG. 5C are formed.

Figure 6A:
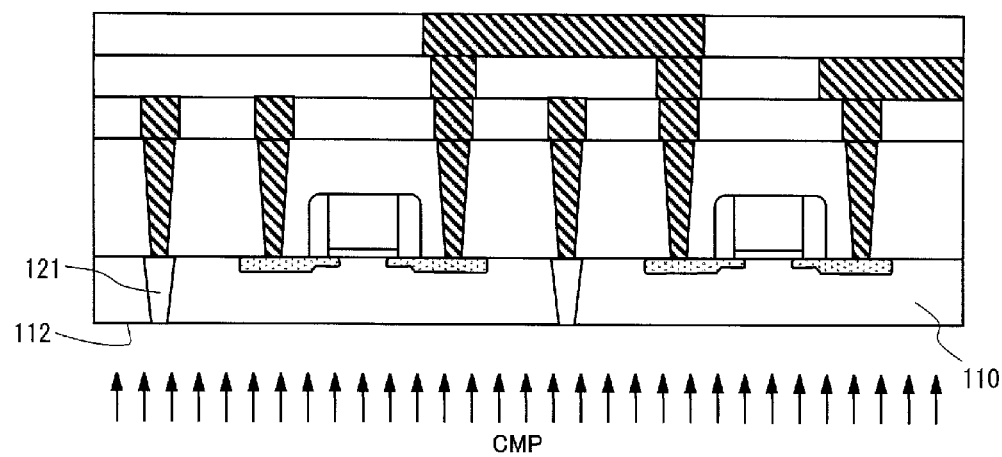
FIG. 6A is a cross-sectional diagram showing the process of polishing a second surface 112 of the substrate 110.

FIG. 6A is a cross-sectional diagram showing the process of polishing the second surface 112 of the substrate 110. After formation of the structure on the first surface 111 of the substrate 110 as shown in FIG. 5C is completed, polishing of the second surface 112 is carried out with CMP. The arrows CMP shown in FIG. 6A show the direction in which the thickness of the substrate 110 changes with the CMP. The CMP is repeated several times while the roughness of the polishing is altered in several steps. With this, the thickness of the substrate 110 decreases to a range of several micrometers to several dozens of micrometers. As a result, the TSVs 121 are exposed at the second surface 112 as shown in FIG. 6A.

Figure 6B:
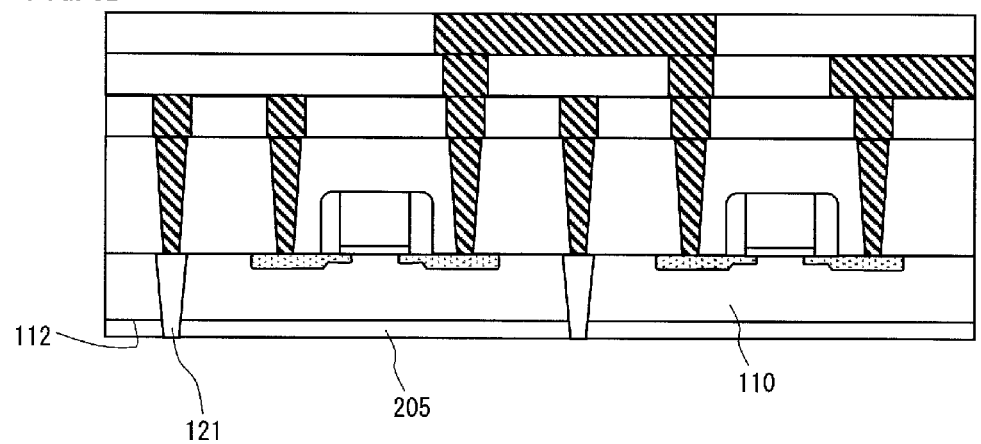
FIG. 6B is a cross-sectional diagram showing the process of forming an insulating film 205 on the second surface 112 of the substrate 110.

FIG. 6B is a cross-sectional diagram showing the process of forming the insulating film 205 on the second surface 112 of the substrate 110. After the polishing process shown in FIG. 6A is completed, first a silicon oxide layer 205 is accumulated on the entirety of the second surface 112 with CVD. Next, the entirety of the silicon oxide layer 205 is covered with a photoresist and exposed to light in the pattern of the TSVs 121. By doing so, parts of the photoresist are removed from the areas where the ends of the TSVs 121 were exposed, and then holes are formed. Next, using the remaining photoresist as a mask, RIE is performed to remove the parts of the silicon oxide layer 205 exposed vias the holes in the photoresist and then deepen the holes. Following that, the insides of the holes are filled with polysilicon by CVD. At this point, polysilicon will be protruding out from the upper ends of the holes. Accordingly, after the holes are filled with polysilicon, the surface of the silicon oxide layer 205 is polished with CMP, which removes the polysilicon protruding from the upper ends of the holes to flatten the surface of the silicon oxide layer 205. By doing so, the ends of the TSVs 121 are re-exposed along with the formation of the insulating film 205.

Figure 6C:
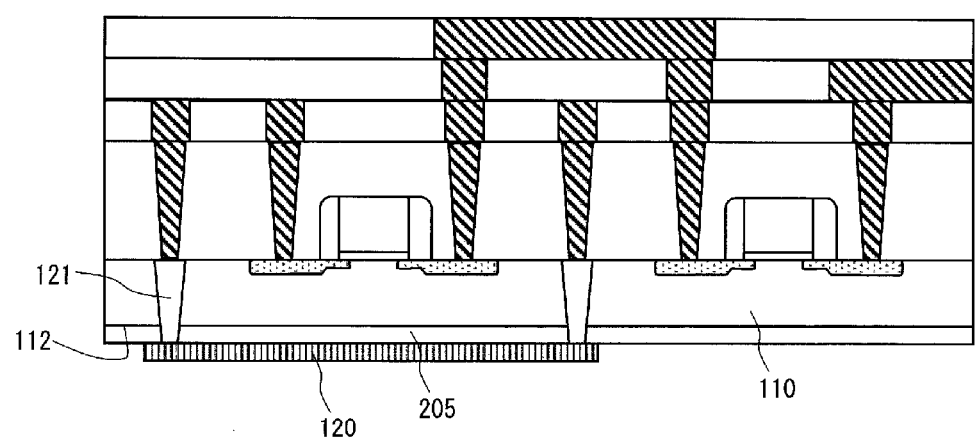
FIG. 6C is a cross-sectional diagram showing the process of forming a resistance heater 120 on the second surface 112 of the substrate 110.

FIG. 6C is a cross-sectional diagram that shows the process of forming the resistance heaters 120 on the second surface 112 of the substrate 110. First, polysilicon is accumulated on the entirety of the insulating film 205 with LPCVD. Next, the entirety of the polysilicon layer is covered with a photoresist, which is exposed to light in the pattern of the resistance heaters 120. By doing so, the photoresist is removed from the entire polysilicon layer except where the resistance heaters 120 should be formed. Next, using the remaining photoresist as a mask, RIE is performed to remove superfluous polysilicon from the surface of the insulating film 205 and then form the resistance heaters 120. Finally, the remaining photoresist is removed.

The transistors to be heated with the resistance heaters 120 are selected by a simulation at the layout design stage. The reason for this is as follows. As shown in FIG. 3, generally when the temperature of a transistor is higher, the threshold voltage thereof is lower. However, since the electron mobility is lower when the temperature is higher, it is not necessarily true that, if the temperature of a transistor is high, its operating speed is bound to rise, in view of the power supply voltage and circuit structure, etc., of the transistor. Accordingly, after an actual simulation, only transistors whose operating speeds actually rise with rise in temperature are selected. One specific example is series P-type MOS transistors. Note that a resistance heater may be placed on the back side of every transistor without carrying out any simulations.

Integrated Circuit Structure

FIG. 7 is a block diagram of an integrated circuit 700 of Embodiment 1 of the present invention. The integrated circuit 700 is a system LSI of a digital television. Alternatively, the integrated circuit 700 may be a system LSI implemented in one of various electronic equipments such as BD (Blu-ray Disc) recorders, digital cameras, cellular telephones, etc., Referring to FIG. 7, the integrated circuit 700 is broadly divided into a core circuit assembly 710 and a control system 720-760. These are implemented in a single substrate. Each of the core circuits 701, 702, 703, . . . is a logic circuit having an individual function and is incorporated as a general-purpose processor or specialized hardware. The core circuits may be, for example, a decoder 701, a digital signal processor (DSP) 702, a CPU, a GPU, etc., Among transistors which make up the core circuits 701, 702, 703, . . . , the transistors which belong to a critical path have the structure shown in FIGS. 1 and 2, especially including resistance heaters 704 and 705. The control system 720-760 is a circuit group for operating the core circuits 701, 702, 703, . . . appropriate to use cases, and comprises a system control unit 720, a memory control unit 730, a frequency control unit 740, a heater control unit 750, and a temperature detection unit 760.

The system control unit 720 is composed of a general-purpose CPU and operates a core circuit appropriate to a use case at appropriate settings. Specifically, the system control unit 720 first either monitors signals UO which show user operation such as remote control operation, etc., or use a stream parser to analyze stream data VS of images, etc., inputted from outside. When the system control unit 720 detects a request for changing use cases from user operation or the results of the stream parser analysis, the system control unit 720 sends instructions INS to various core circuits. For example, let us suppose that a user changes a viewing target from a terrestrial digital television broadcasting program to online video content. When the user presses the network switch on a remote control during viewing of the program, the system control unit 720 detects a signal UO from the remote control and performs the following series of processes. First, the system control unit 720 selects and activates a network interface circuit from within the core circuit assembly 710 and begins preparations for receiving the video content from a network. Next, the system control unit 720 stops a stream processing circuit within the core circuit assembly 710; the stream processing circuit is used for displaying the aforementioned program. Furthermore, the system control unit 720 causes the memory control unit 730 to alter a bandwidth of the external memory MR that should be allocated to each core circuit. Here, the external memory MR is a memory element attached to the integrated circuit 700, and includes a frame memory in particular.

The memory control unit 730 mediates access to the external memory MR by each core circuit 701, 702, 703, . . . . In particular, the memory control unit 730 complies with instructions from the system control unit 720 to adjust, according to use cases, a bandwidth of the external memory MR that should be allocated to each core circuit.

The frequency control unit 740 complies with instructions from the system control unit 720 to control the operating frequency of each core circuit according to use cases. For example, if only displaying of a recorded program is to be performed, the frequency control unit 740 sets the operating frequency of the decoder 701 to 100 MHz. If transcode recording of one and two background programs is to be performed along with the displaying of a recorded program, then the frequency control unit 740 sets the operating frequency of the decoder 701 to 200 MHz and 300 MHz, respectively. Alternatively, if a viewing target is changed from HD (High-Definition) images of terrestrial digital television broadcasting to 4K2K images distributed over networks, the frequency control unit 740 raises the operating frequencies of both the decoder 701 and the DSP 702. Because 4K2K resolution is four times as high as HD resolution, 4K2K processing necessitates higher operating speeds for the decoder 701 and DSP 702, compared to HD processing. The relationship between the use cases and the operating frequencies is tabulated and saved in advance in the frequency control unit 740. The frequency control unit 740 also includes a timer 741, and using this, determines timings for actually altering operating frequencies.

The heater control unit 750 applies electric current to the resistance heaters 704 and 705 within each of the core circuits 701, 702, 703, . . . , and adjusts the amount of that electric current in accordance with use cases. Here, electric current flowing to each resistance heater within a single core circuit is maintained at the same level. The heater control unit 750 includes a use case change monitoring unit 751, a current source 752, a plurality of switches 753A, 753B, 753C, . . . , and a temperature monitoring unit 754.

The current source 752 uses a fixed power supply voltage to generate electric current to a predetermined amount. The amount of the electric current may be fixed or adjustable. The plurality of switches 753A, 753B, 753C, . . . are connected individually to different core circuits. The switches either allow or block connections between the current source 752 and the resistance heaters 704 and 705 within the core circuits. In the example shown in FIG. 7, while the first switch 753A is ON, electric current flows between the current source 752 and the resistance heater 704 within the decoder 701. While the second switch 753B is ON, electric current flows between the current source 752 and the resistance heater 705 within the DSP 702.

The use case change monitoring unit 751 monitors the instructions INS sent from the system control unit 720 to the core circuit assembly 710 and analyzes the use case change pattern from the instructions INS. Based on the results of the analysis, the use case change monitoring unit 751 furthermore selects a core circuit where electric current should flow to resistance heaters. For example, if the viewing target is changed from HD images of terrestrial digital television broadcasting to 4K2K images distributed over networks, the decoder 701 and DSP 702 should be selected. The relationship between use cases and core circuits to be selected is tabulated and saved in advance in the use case change monitoring unit 751. The use case change monitoring unit 751 next turns ON, among the switches 753A, 753B, 753C, . . . , the switch that is connected to the selected core circuit. With this, electric current flows between the resistance heaters within the selected core circuit and the current source 752. When the current source 752 maintains the amount of the electric current at a fixed level, the use case change monitoring unit 751 controls the duty ratio of the switch (the ratio of ON time to the total time) to regulate the amount of the time when the electric current is flowing continuously to the resistance heaters. With this, the average amount of the electric current flowing to the resistance heaters can be regulated. Alternatively, when the current source 752 can vary the amount of electric current, the use case change monitoring unit 751 adjusts the amount of the electric current flowing to the resistance heaters using the current source 752. In this way, the amount of the electric current flowing to the resistance heaters is adjusted.

At the same time as turning one of the switches ON, the use case change monitoring unit 751 also sets the timer 741 in the frequency control unit 740 to a preheating time Tth, and starts up the timer 741. The preheating time Tth is the time required for the resistance heater in the selected core circuit to raise the temperature of a transistor to reach a desired value from the moment the switch is turned ON. For example, in the case that only displaying of a recorded program is to be performed, the use case change monitoring unit 751 sets the preheating time Tth to 500 milliseconds. With this, the transistor temperature reaches 50 degrees Celsius. In the case that, alongside displaying of a recorded program, recording of one and two other background programs is to be performed, the use case change monitoring unit 751 sets the preheating time Tth to 700 milliseconds and 1000 milliseconds, respectively. With this, the transistor temperature reaches 60 degrees Celsius and 70 degrees Celsius, respectively. The relationship between the use case change pattern and the preheating time Tth is tabulated and saved in advance in the use case change monitoring unit 751. When the frequency control unit 740 detects the elapse of the preheating time Tth with the timer 741, it raises the operating frequency of the core circuit selected by the use case change monitoring unit 751. At this time, the temperature of transistors on a critical path of the core circuit will be sufficiently high, and thus the operating speeds of the transistors will be sufficiently high. Accordingly, the core circuit will reliably have a high operating speed.

The temperature monitoring unit 754 monitors the temperature of each part of the core circuit assembly 710 detected by the temperature detection unit 760. Furthermore, in the case that the temperature of the core circuit selected by the use case change monitoring unit 751 or the temperature of its surrounding area exceeds a predetermined permissible range, the temperature monitoring unit 754 turns the switch connected to that core circuit OFF. Subsequently, when the temperature falls below the permissible range, the switch connected to that core circuit is turned ON again. Here, the permissible range is set by the use case change monitoring unit 751 in accordance with use cases. For example, in the case that only displaying of a recorded program is to be performed, the permissible range is set at 50 degrees Celsius plus or minus a few degrees. In the case that, along with the displaying of a recorded program, recording of one and two other background programs is to be performed, the permissible range is set at 60 degrees Celsius plus or minus a few degrees, and 70 degrees Celsius plus or minus a few degrees, respectively. The relationship between use cases and the permissible range is tabulated and saved in advance in the temperature monitoring unit 754.

The temperature detection unit 760 is installed in each part of the core circuit assembly 710 and detects the temperature therein. Specifically, the temperature detection unit 760 includes resistors embedded in or around the core circuits 701, 702, 703, . . . , a power source which sends electric current to each resistor individually, and a circuit which measures the amount of the electric current which flows to each resistor. Because the amount of the electric current changes according to the temperature of the resistor, the temperature detection unit 760 determines the temperature of the resistor from the measured value of the electric current.

Control of Core Circuit Operating Speeds

FIG. 8 is a flow chart for a situation where the integrated circuit 700 of Embodiment 1 of the present invention controls the operating speed of each core circuit. This control is begun when the system control unit 720 detects a use case change request from user operation or a stream parser analysis result.

In step S801, the use case change monitoring unit 751 monitors instructions INS which are sent from the system control unit 720 to each core circuit. The use case change monitoring unit 751 determines from the instructions INS whether or not a use case change request shows a change of a viewing target from a terrestrial digital television broadcasting program to online video content. If the use case change request shows such a change, the process proceeds to step S802. If the use case change request does not show this kind of change, the process repeats step S801 again.

In step S802, the use case change monitoring unit 751 turns the switch 753A connected to the decoder 7010N. With this, electric current begins to flow between the current source 752 and the resistance heater 704 within the decoder 701. Subsequently, the process proceeds to step S803.

In step S803, the use case change monitoring unit 751 retrieves from the table a preheating time Tth for the start-up of the decoder 701, and sets the timer 741 to the preheating time Tth. The use case change monitoring unit 751 then starts the timer 741. With this, the timer 741 starts timing. Subsequently, the process proceeds to step S804.

In step S804, the frequency control unit 740 monitors the output of the timer 741. When the output shows the elapse of the preheating time Tth from the moment of startup, the process proceeds to step S805.

In step S805, the frequency control unit 740 raises the operating frequency of the decoder 701. With this, the operating speed of the decoder 701 rises. Subsequently, the process proceeds to step S806.

In step S806, the temperature monitoring unit 754 monitors the temperature of the decoder 701 or its surrounding area. If the temperature exceeds the permissible range, the process proceeds to step S807. If the temperature does not exceed the permissible range, the process proceeds to step S808.

In step S807, the temperature monitoring unit 754 turns the switch 753A that is connected to the decoder 701 OFF to stop electric current flowing to the resistance heaters 704 within the decoder 701. Alternatively, the temperature monitoring unit 754 lowers the duty ratio of the switch 753A to reduce the electric current flowing to the resistance heaters 704. Subsequently, the process proceeds to step S810.

In step S808, the temperature monitoring unit 754 determines whether or not the temperature of the decoder 701 or its surrounding area has fallen below the permissible range. If the temperature has fallen below the permissible range, the process proceeds to step S809. If the temperature is within the permissible range, the process proceeds to step S810.

In step S809, the temperature monitoring unit 754 turns the switch 753A that is connected to the decoder 7010N to allow electric current to flow once again to the resistance heaters 704 within the decoder 701. Alternatively, the temperature monitoring unit 754 raises the duty ratio of the switch 753A to increase the amount of electric current flowing to the resistance heaters 704 within the decoder 701. Subsequently, the process proceeds to step S810.

In step S810, the system control unit 720 determines whether or not to continue the operation of each core circuit. If the operation is to be continued, the process is repeated from step S806. If the operation is to be ceased, the system control unit 720 ceases the operation of the frequency control unit 740 and the heater control unit 750. With this, the process ends.

The integrated circuit 700 of Embodiment 1 of the present invention adjusts, using the resistance heaters, the temperature of a core circuit, in particular the temperature of transistors on a critical path, to a suitable value in accordance with use cases, as shown above. As a result, the threshold voltages of the transistors are adjusted to a suitable value; therefore it is possible to balance the operating speed and electric power consumption of the core circuit. For example, the integrated circuit raises the operating frequencies of the decoder 701 and the DSP 702 higher when displaying online video content than when displaying a terrestrial digital television broadcast, and accordingly allows electric current to flow to resistance heaters of the decoder 701 and the DSP 702. Thus, the temperature of transistors on critical paths of the decoder 701 and the DSP 702 increases and accordingly their threshold voltages decrease, and therefore their operating speeds reliably rise. On the other hand, the integrated circuit keeps the operating frequencies of the decoder 701 and the DSP 702 comparatively low when displaying a terrestrial digital television broadcast, and accordingly stops the electric current flowing to resistance heaters of the decoder 701 and the DSP 702. Thus, the temperature of the critical path transistors is kept comparatively low, and their threshold voltages are kept comparatively high. As a result, leakage current reduces, and therefore it is possible to suppress the electric power consumption of the decoder 701 and the DSP 702. In this way, the integrated circuit 700 dynamically controls the operating speeds of the core circuits to achieve both a reduction in electric power consumption and an increase in operating speed.

Embodiment 2

Figure 9:
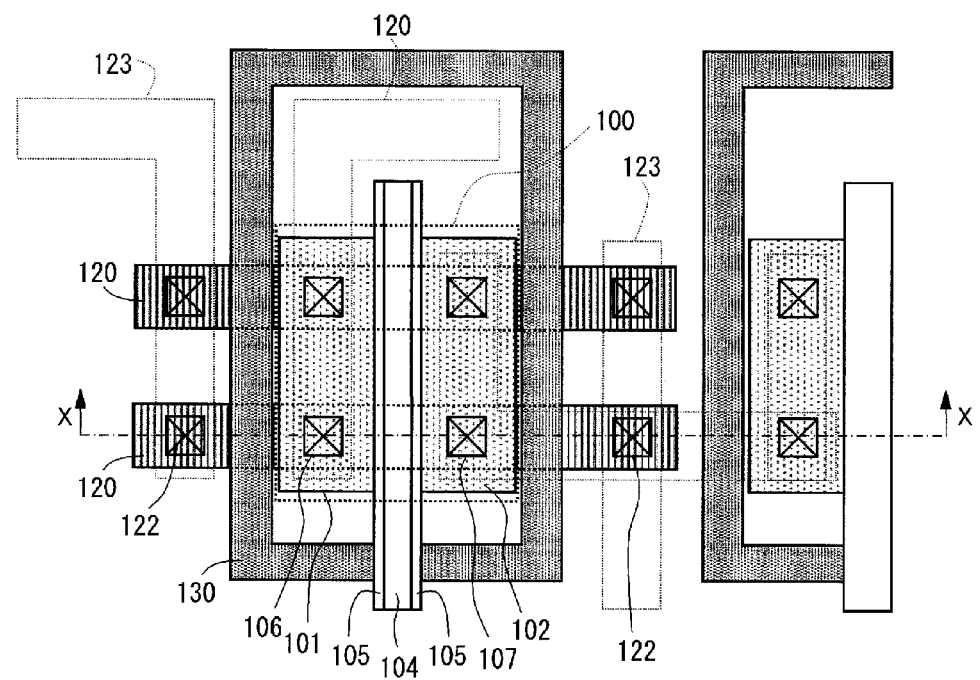
FIG. 9 is a layout diagram of a transistor and its surroundings included in an integrated circuit of Embodiment 2 of the present invention.
Figure 10:
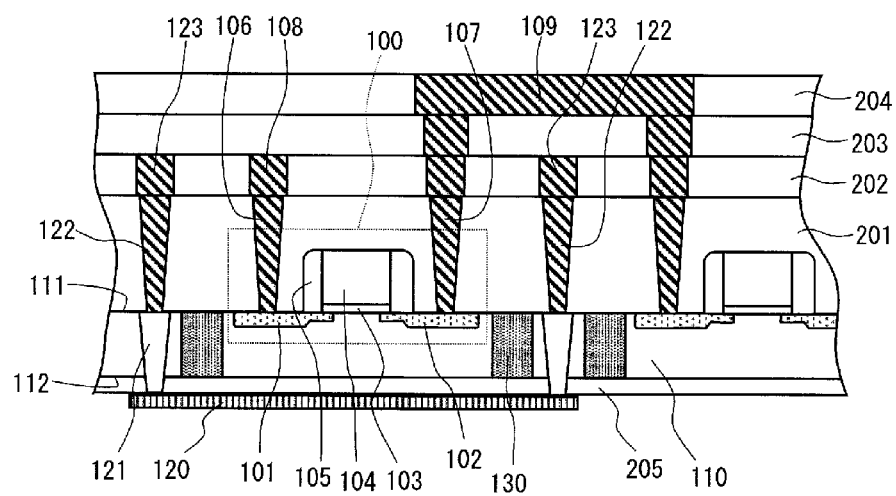
FIG. 10 is a cross-sectional diagram taken along the line X-X shown in FIG. 9.

FIG. 9 is a layout diagram of a transistor and its surrounding area included in an integrated circuit of Embodiment 2 of the present invention. FIG. 10 is a cross-sectional diagram taken along the line X-X shown in FIG. 9. The structure shown in FIGS. 9 and 10 differs from the structure of Embodiment 1 shown in FIGS. 1 and 2 in that a transistor 100 is surrounded by a thermal insulator 130 and thermally isolated from its external areas. Since other elements of Embodiment 2 are similar to those of Embodiment 1, the following explanation will mainly describe modifications from Embodiment 1. A description about the similar elements may be found in the explanation about Embodiment 1.

Referring to FIG. 9, the transistor 100 is surrounded by the rectangular frame-shaped thermal insulator 130. Referring to FIG. 10, the thermal insulator 130 is placed between each of the diffusion areas 101 and 102 and each of the TSVs 121 so as to separate the substrate 110. The thermal insulator 130 is formed of material such as silicon oxide that has lower conductivity than silicon and aluminium, and does not pollute peripheral materials (in other words, does not cause any contamination of the peripheral materials). The thermal insulator 130 may alternatively be in a region where air or nanomaterials have been trapped in the substrate 110. Joule heat produced by the resistance heater 120 is blocked by the thermal insulator 130, and thus hardly propagates to the outside. Accordingly, it is possible to further improve efficiency when selectively heating the transistor 100 by using the resistance heater 120.

Transistor Laminating Process

FIGS. 11-13 show the laminating process of the structure shown in FIGS. 9 and 10. All transistors included in the integrated circuit of Embodiment 2 of the present invention have been laminated with a similar process.

Figure 11A:
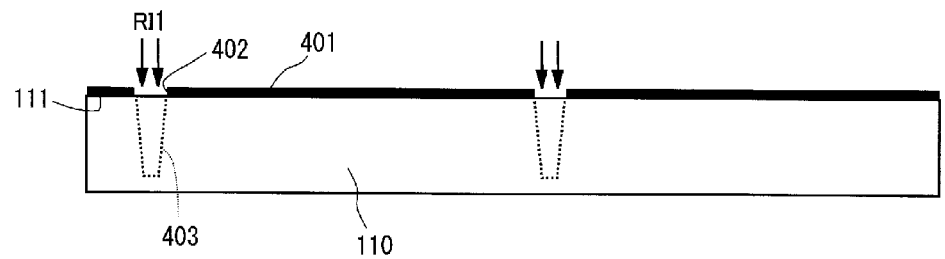
FIG. 11A is a cross-sectional diagram showing the process of forming TSVs 121 in a substrate 110.

FIG. 11A is a cross-sectional diagram showing the process of forming the TSVs 121 in the substrate 110. The process shown in FIG. 11A is similar to that shown in FIG. 4A. First, the first surface 111 of the substrate 110 is covered with a photoresist 401, which is exposed to light in the pattern of the TSVs 121 to include holes 402. Next, using the remaining photoresist as a mask, RIE is performed to remove parts of the substrate 110 which are exposed through the holes 402 of the photoresist and then vias 403 are formed. Following that, after the photoresist 401 are removed from the entirety of the first surface 111, CVD is used to form insulating films by coating the inner surfaces of the vias 403 with silicon oxide. Subsequently, CVD is further used to fill the vias 403 with polysilicon. Next, the first surface 111 is polished with CMP, which removes the polysilicon protruding from the upper ends of the vias 403 and to flatten the first surface 111. In this way, the TSVs 121 are formed.

Figure 11B:
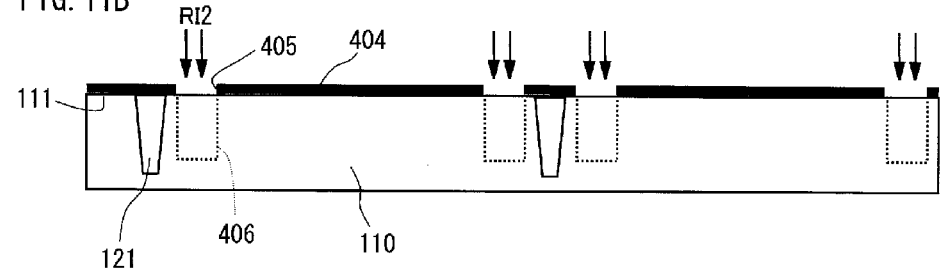
FIG. 11B is a cross-sectional diagram showing the process of forming thermal insulators 130 in the substrate 110.

FIG. 11B is a cross-sectional diagram showing the process of forming the thermal insulators 130 in the substrate 110. After the TSVs 121 are formed, the first surface 111 of substrate 110 is first covered again with the photoresist 404 and exposed to light in the pattern of the thermal insulators 130. Then, parts of the photoresist 404 are removed from the areas where the thermal insulators 130 are to be formed, and thus holes 405 appear. Next, using the remaining photoresist as a mask, RIE is performed to remove parts of the substrate 110 which are exposed through the holes 404 and then form trench-shaped vias 406 (see the dotted line sections of FIG. 11B). The arrows RI2 shown in FIG. 11B indicate ion current used in the RIE. Subsequently, after the photoresist 404 are removed from the entirety of the first surface 111, the insides of the vias 406 are filled with silicon oxide by CVD. At this point, silicon oxide will be protruding out of the upper ends of the vias 406. Accordingly, after the vias 406 are filled with silicon oxide, the first surface 111 is polished with CMP, which removes the silicon oxide protruding from the upper ends of the vias 406 to flatten the first surface 111. In this way, the thermal insulators 130 are formed.

Figure 11C:
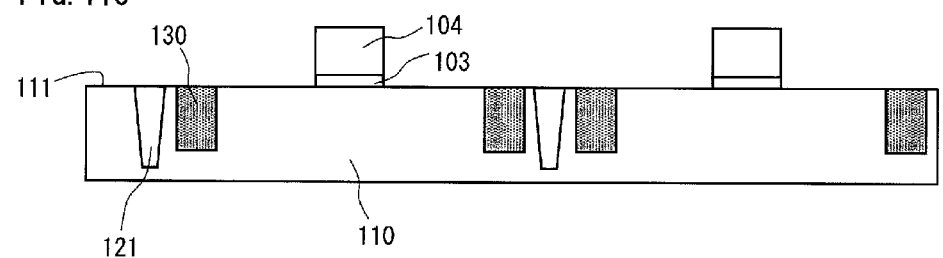
FIG. 11C is a cross-sectional diagram showing the process of laminating gate oxide films 103 and gate electrodes 104 onto a first surface 111 of the substrate 110.

FIG. 11C is a cross-sectional diagram showing the process of laminating the gate oxide films 103 and the gate electrodes 104 onto the first surface 111 of substrate 110. The process shown in FIG. 11C is similar to that shown in FIG. 4B. After the thermal insulators 130 are formed, first the entirety of the first surface 111 is thermally oxidized to be covered with a layer of silicon oxide. Next, polysilicon is accumulated on the entirety of the silicon oxide layer by LPCVD. Following that, the entirety of this polysilicon layer is coated with a photoresist, and exposed to light in the pattern of the gate electrodes 104. By doing so, the photoresist is removed from all but the areas where the gate electrodes 104 should be formed. Using the remaining photoresist as a mask, RIE is performed to remove the superfluous silicon oxide and polysilicon from the first surface 111, and then form the gate oxide films 103 and the gate electrodes 104. Finally, the remaining photoresist is removed.

Figure 11D:
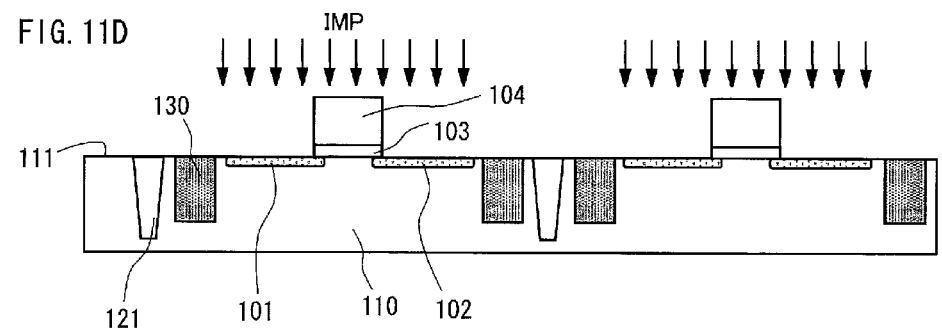
FIG. 11D is a cross-sectional diagram showing the process of forming diffusion areas.

FIG. 11D is a cross-sectional diagram showing the process of forming the diffusion areas. The process shown in FIG. 11D is similar to that shown in FIG. 4C. The gate electrodes 104 are used as a mask, and impurity ions such as boron or phosphor are infused into the first surface 111 of the substrate 110. In this way, the diffusion areas 101 and 102 are thinly formed on either side of each of the gate electrodes 104.

Figure 12A:
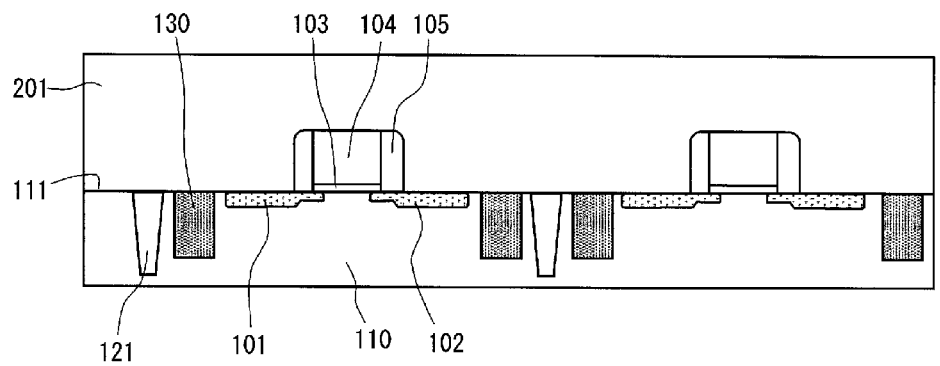
FIG. 12A is a cross-sectional diagram showing the process of forming sidewalls 105 and an interlayer insulating film 201.

FIG. 12A is a cross-sectional diagram showing the process of forming the sidewalls 105 and the interlayer insulating films 201. The process shown in FIG. 12A is similar to that shown in FIG. 5A. After the diffusion areas 101 and 102 are formed, first the entirety of the first surface 111 of the substrate 110 is covered with a layer of silicon nitride by LPCVD. Next, anisotropic etching is performed so that the silicon nitride layer remains only on the sides of the gate oxide films 103 and the gate electrodes 104. By doing so, the sidewalls 105 are formed. Following that, using the gate electrodes 104 and the sidewalls 105 as a mask, impurity ions such as boron or phosphor are additionally infused into the first surface 111. As a result, the thickness of the diffusion areas 101 and 102 increases on the outer sides of the sidewalls 105. After the impurity ions are infused, the entirety of the first surface 111 is covered with a silicon oxide coating to form the interlayer insulating film 201.

Figure 12B:
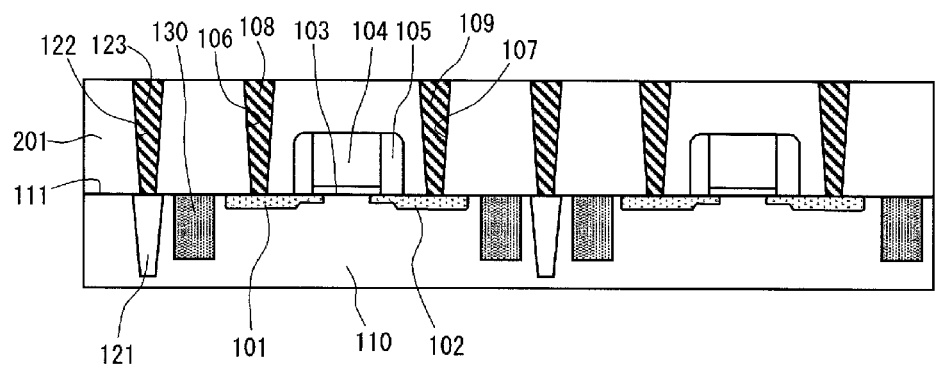
FIG. 12B is a cross-sectional diagram showing the process of forming contact holes 106, 107 and 122 in the interlayer insulating film 201.

FIG. 12B is a cross-sectional diagram showing the process of forming the contact holes 106, 107 and 122 in the interlayer insulating film 201. The process shown in FIG. 12B is similar to that shown in FIG. 5B. First, the entirety of the interlayer insulating film 201 is covered with a photoresist, and exposed to light in the pattern of the contact holes 106, 107 and 122, and then holes are formed. Next, using the remaining photoresist as a mask, RIE is performed to remove parts of the interlayer insulating film 201 which are exposed through the holes of the photoresist and then deepen the holes. Following that, CVD is used to fill the insides of the holes with aluminum, tungsten, or copper. Afterwards, the surface of the interlayer insulating film 201 is polished with CMP, which removes the polysilicon protruding from the upper ends of the holes to flatten the surface of the interlayer insulating film 201. In this way, the contact holes 106, 107 and 122 are formed.

Figure 12C:
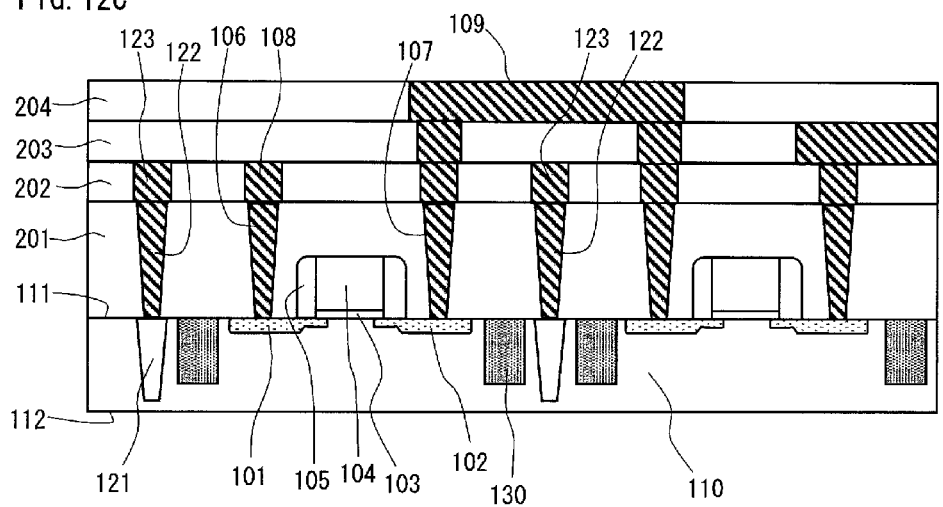
FIG. 12C is a cross-sectional diagram showing the process of forming multilayer traces 108, 109 and 123.

FIG. 12C is a cross-sectional diagram showing the process of forming the multilayer traces 108, 109 and 123. The process shown in FIG. 12C is similar to that shown in FIG. 5C. First, the entirety of the interlayer insulating film 201 is covered with a silicon oxide layer 202 by CVD. Next, the entirety of the silicon oxide layer 202 is covered with a photoresist, and is exposed to light in the pattern of the traces 108, 109 and 123 as indicated by the dotted lines shown in FIG. 1, and then holes are formed. Next, using the remaining photoresist as a mask, RIE is performed to remove the parts of the silicon oxide layer 202 which are exposed through the holes of the photoresist and then deepen the holes. Following that, plating or spattering is used to fill the insides of the holes with aluminum or copper. Afterwards, the surface of the silicon oxide layer 202 is polished with CMP, which removes the metal protruding from the upper ends of the holes to flatten the surface of the silicon oxide layer 202. In this way, the traces 108, 109 and 123 within the silicon oxide layer 202 are formed. After that, each time one of the silicon oxide layers 203 and 204 are newly laminated, a similar process is repeated. In this way, the multilayer traces shown in FIG. 12C are formed.

Figure 13A:
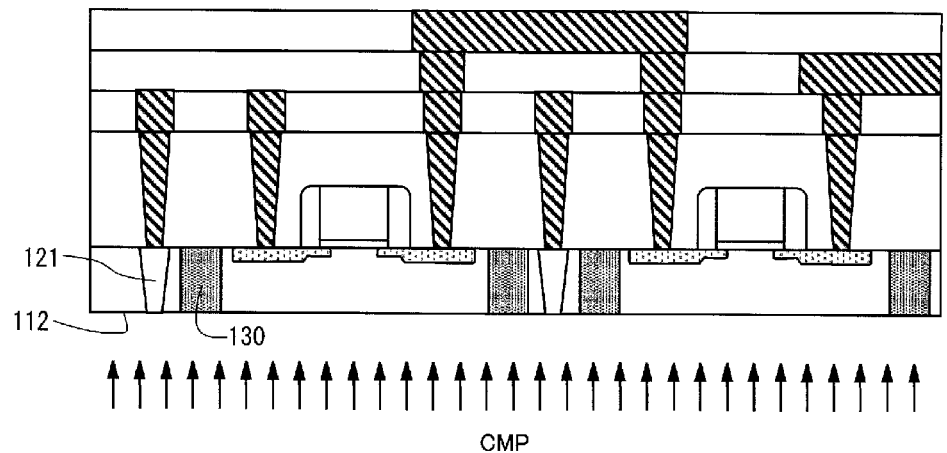
FIG. 13A is a cross-sectional diagram showing the process of polishing a second surface 112 of the substrate 110.

FIG. 13A is a cross-sectional diagram showing the process of polishing the second surface 112 of the substrate 110. The process shown in FIG. 13A is similar to that shown in FIG. 6A. After formation of the structure on the first surface 111 of the substrate 110 shown in FIG. 12C is completed, polishing of the second surface 112 is carried out with CMP. With this, the thickness of the substrate 110 decreases to a range of several micrometers to several dozen of micrometers. As a result, the TSVs 121 and the thermal insulators 130 are exposed at the second surface 112 as shown in FIG. 13A.

Figure 13B:
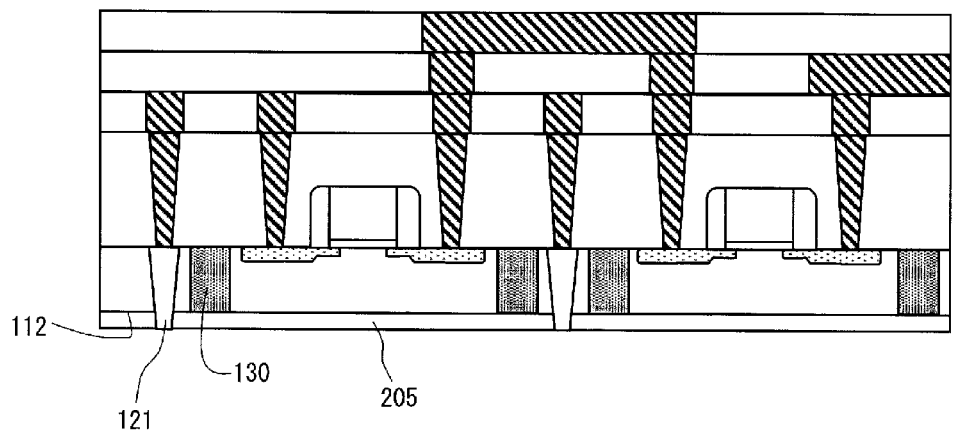
FIG. 13B is a cross-sectional diagram showing the process of forming an insulating film 205 on the second surface 112 of the substrate 110.

FIG. 13B is a cross-sectional diagram showing the process of forming the insulating film 205 on the second surface 112 of the substrate 110. The process shown in FIG. 13B is similar to that shown in FIG. 6B. After the polishing process shown in FIG. 13A is completed, first a silicon oxide layer 205 is accumulated on the entirety of the second surface 112 with CVD. Next, the entirety of the silicon oxide layer 205 is covered with a photoresist and exposed to light in the pattern of the TSVs 121, and then holes are formed. Next, using the remaining photoresist as a mask, RIE is performed to remove the parts of the silicon oxide layer 205 exposed through the holes in the photoresist and then deepen the holes. Following that, the insides of the holes are filled with polysilicon by CVD. Afterwards, the surface of the silicon oxide layer 205 is polished with CMP, which removes the polysilicon protruding from the upper ends of the holes to flatten the surface of the silicon oxide layer 205. In this way, the ends of the TSVs 121 are re-exposed along with the formation of the insulating film 205.

Figure 13C:
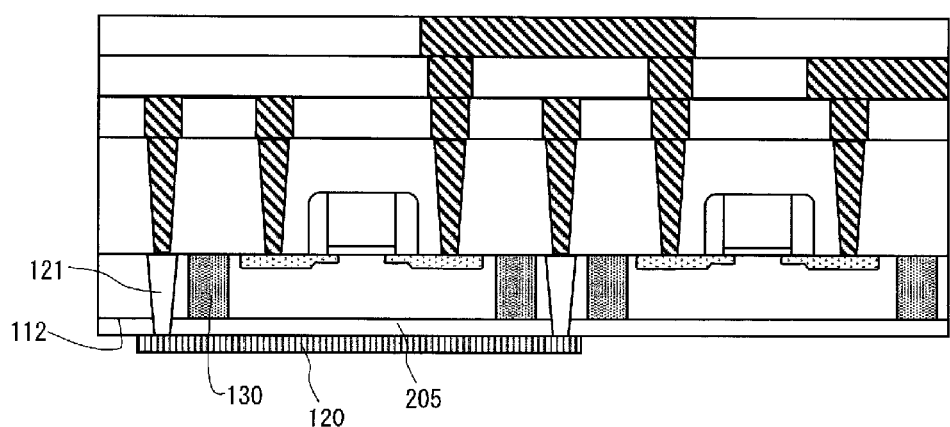
FIG. 13C is a cross-sectional diagram showing the process of forming a resistance heater 120 on the second surface 112 of the substrate 110.

FIG. 13C is a cross-sectional diagram that shows the process of forming the resistance heaters 120 on the second surface 112 of the substrate 110. The process shown in FIG. 13C is similar to that shown in FIG. 6C. First, polysilicon is accumulated on the entirety of the insulating film 205 with LPCVD. Next, the entirety of the polysilicon layer is covered with a photoresist, which is exposed to light in the pattern of the resistance heaters 120. Then, the photoresist is removed from all of the polysilicon layer except the parts where the resistance heaters 120 should be formed. Next, using the remaining photoresist as a mask, RIE is performed to remove superfluous polysilicon from the surface of the insulating film 205 and then form the resistance heaters 120. Finally, the remaining photoresist is removed.

Embodiment 3

Figure 14:
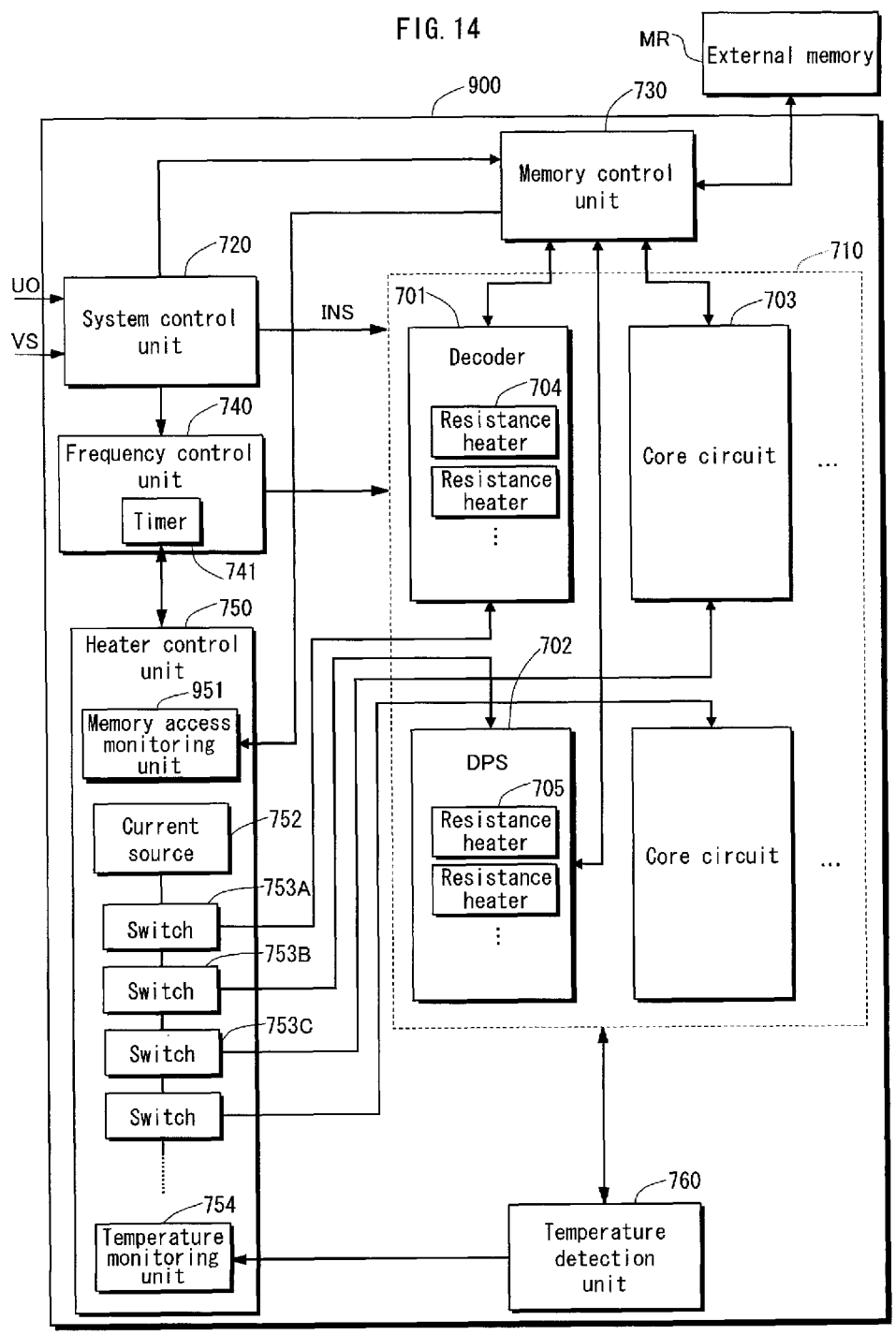
FIG. 14 is a block diagram of an integrated circuit 900 of Embodiment 3 of the present invention.

FIG. 14 is a block diagram of an integrated circuit 900 of Embodiment 3 of the present invention. The integrated circuit 900 differs from the integrated circuit 700 of Embodiment 1 shown in FIG. 7 in that the heater control unit 750 is provided with a memory access monitoring unit 951 instead of the use case change monitoring unit 751. Other elements are similar to those of the integrated circuit 700 shown in FIG. 7. Accordingly, the following explanation will mainly describe additions and modifications from Embodiment 1. A description of the similar elements may be found in the explanation about Embodiment 1.

The memory access monitoring unit 951 monitors requests for access to the external memory MR which the memory control unit 730 receives from each core circuit 701, 702, 703, . . . . In particular, the memory access monitoring unit 951 detects the frequency of access to the external memory MR by each core circuit, in other words, the bandwidth of the external memory MR allocated to each core circuit. The memory access monitoring unit 951 furthermore selects a core circuit which has been allocated a comparatively high bandwidth. The memory access monitoring unit 951 next turns ON, among the switches 753A, 753B, 753C, . . . , the switch that is connected to the selected core circuit. By doing so, electric current flows between the resistance heaters within the selected core circuit and the current source 752. When the current source 752 maintains the amount of the electric current at a fixed level, the memory access monitoring unit 951 controls the duty ratio of the switch to regulate the amount of the time when the electric current is flowing continuously to the resistance heaters. With this, the average amount of the electric current flowing to the resistance heaters can be regulated. Alternatively, when the current source 752 can vary the amount of electric current, the memory access monitoring unit 951 adjusts the amount of the electric current flowing to the resistance heaters using the current source 752. By doing so, the amount of the electric current flowing to the resistance heaters is adjusted.

Note that, instead of measuring the frequency of actual access to the memory by the memory control unit 730 as above, the memory access monitoring unit 951 may detect a bandwidth of the external memory MR allocated to each core circuit, i.e., a bandwidth limit value.

At the same time as turning one of the switches ON, the memory access monitoring unit 951 also sets the timer 741 in the frequency control unit 740 to a preheating time Tth, and starts up the timer 741. For example, when a bandwidth of the external memory MR allocated to the decoder 701 is at 500 MB/s, 1000 MB/s, and 1500 MB/s, the memory access monitoring unit 951 sets the preheating time Tth to 2 seconds, 5 seconds, and 10 seconds, respectively. The relationship between bandwidths of the external memory MR allocated to the selected core circuit and the preheating time Tth is tabulated and saved in advance in the memory access monitoring unit 951. When the frequency control unit 740 detects the elapse of the preheating time Tth with the timer 741, it raises the operating frequency of the core circuit selected by the memory access monitoring unit 951. At this time, the temperature of transistors on a critical path of the core circuit will be sufficiently high, and thus the operating speeds of the transistors will be sufficiently high. Accordingly, the core circuit will reliably have a high operating speed.

Control of Core Circuit Operating Speeds

Figure 15:
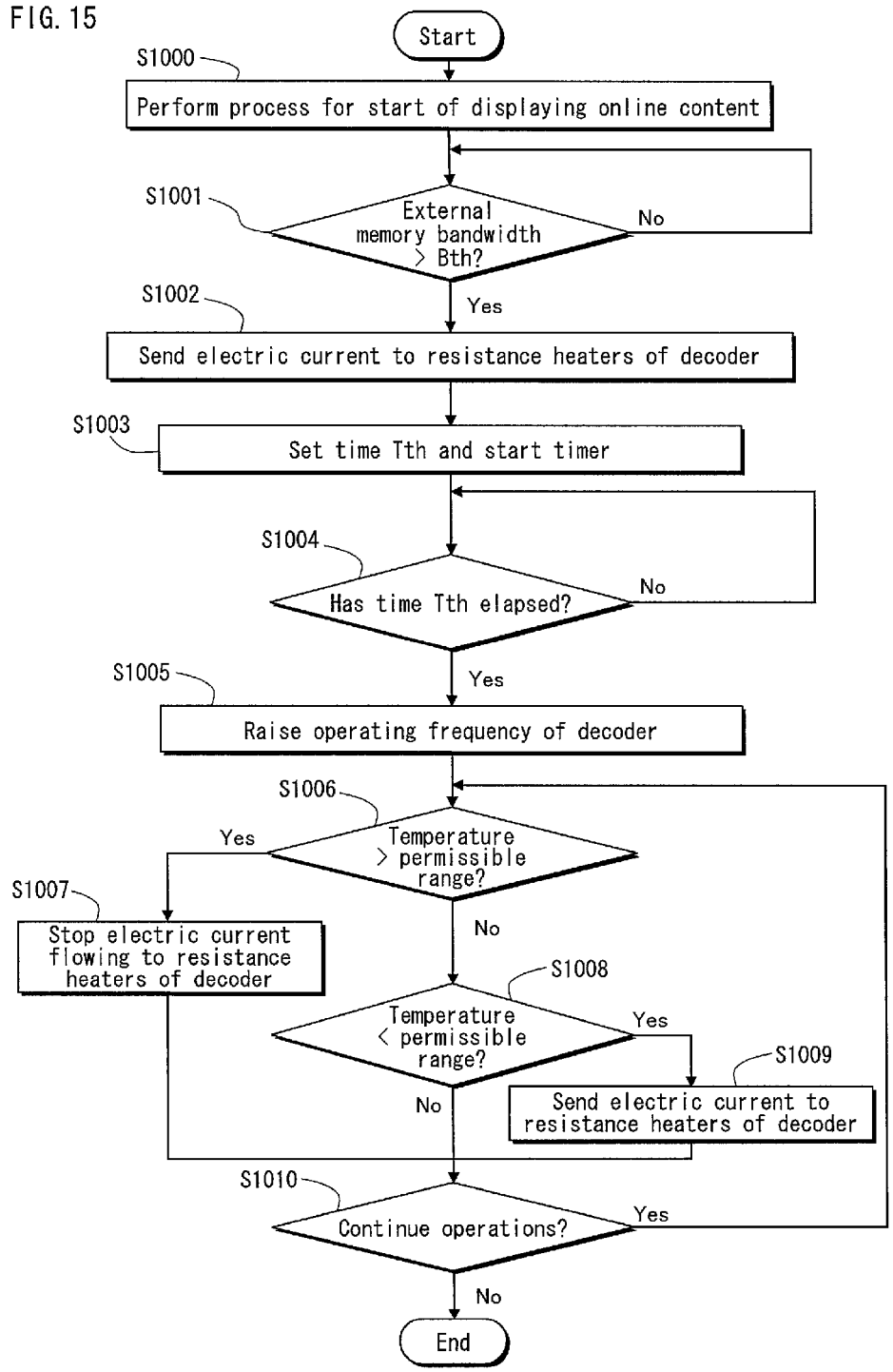
FIG. 15 is a flow chart for a situation where the integrated circuit 900 of Embodiment 3 of the present invention controls the operating speed of each core circuit.

FIG. 15 is a flow chart for a situation where the integrated circuit 900 of Embodiment 3 of the present invention controls the operating speed of each core circuit. This control is begun when the system control unit 720 determines the change of a viewing target from a terrestrial digital television broadcasting program to online video content in response to user operation or a stream parser analysis result.

In step S1000, the system control unit 720 detects, from the signal UO from a remote control or from the stream data VS, a request that the viewing target should be changed from the terrestrial digital television broadcasting program to online video content. The system control unit 720 then initiates displaying of the content. In more detail, the system control unit 720 first selects and starts a network interface circuit from among the core circuit assembly 710, and begins preparations to receive the video content from a network. The system control unit 720 next stops the operation of the stream processing circuit in the core circuit assembly 710, which is used for displaying the aforementioned program. The system control unit 720 furthermore causes the memory control unit 730 to change a bandwidth of the external memory MR that is to be allocated to each core circuit. Subsequently, the process proceeds to step S1001.

In step S1001, the memory access monitoring unit 951 monitors requests for access to the external memory MR received by the memory control unit 730 from the core circuits 701, 702, 703, . . . . In particular, the memory access monitoring unit 951 detects the frequency of access to the external memory MR by the decoder 701, in other words, the bandwidth of the external memory MR allocated to the decoder 701. The memory access monitoring unit 951 furthermore checks whether or not the bandwidth exceeds a predetermined threshold value Bth. If the bandwidth exceeds the threshold value Bth, the process proceeds to step S1002, and if it does not, the process repeats step S1001 again.

In step S1002, the memory access monitoring unit 951 turns the switch 753A connected to the decoder 7010N. By doing so, electric current starts to flow between the current source 752 and the resistance heaters 704 within the decoder 701. Subsequently, the process proceeds to step S1003.

In step S1003, the memory access monitoring unit 951 retrieves, from the table, a preheating time Tth to be used when the bandwidth of the external memory MR allocated to the decoder 701 exceeds the threshold value Bth, and sets the timer 741 to the preheating time Tth. The memory access monitoring unit 951 then starts the timer 741. With this, the timer 741 starts timing. Subsequently, the process proceeds to step S1004.

In step S1004, the frequency control unit 740 monitors the output of the timer 741. When the output shows the elapse of the preheating time Tth from the moment of startup, the process proceeds to step S1005.

In step S1005, the frequency control unit 740 raises the operating frequency of the decoder 701. By doing so, the operating speed of the decoder 701 rises. Subsequently, the process proceeds to step S1006.

In step S1006, the temperature monitoring unit 740 monitors the temperature of the decoder 701 or its surrounding area. If the temperature exceeds the permissible range, the process proceeds to step S1007. If the temperature does not exceed the permissible range, the process proceeds to step S1008.

In step S1007, the temperature monitoring unit 754 turns the switch 753A connected to the decoder 701 OFF to stop the electric current flowing to the resistance heaters 704 within the decoder 701. Alternatively, the temperature monitoring unit 754 may lower the duty ratio of the switch 753A to reduce the amount of the electric current flowing to the resistance heaters 704 within the decoder 701. Subsequently, the process proceeds to step S1010.

In step S1008, the temperature monitoring unit 754 confirms whether or not the temperature of the decoder 701 or its surrounding area is below the permissible range. If the temperature is below the permissible range, the process proceeds to step S1009. If the temperature is within the permissible range, the process proceeds to step S1010.

In step S1009, the temperature monitoring unit 754 turns the switch 753A connected to the decoder 7010N to cause electric current to flow again to the resistance heaters 704 within the decoder 701. Alternatively, the temperature monitoring unit 754 raises the duty ratio of the switch 753A to increase the amount of electric current flowing to the resistance heaters 704 within the decoder 701. Subsequently, the process proceeds to step S1010.

In step S1010, the system control unit 720 determines whether or not to continue operation of each core circuit. If the operation is to be continued, the process repeats from step S1006. If the operation is to be ceased, the system control unit 720 ceases the operation of the frequency control unit 740 and heater control unit 750. With this, the process ends.

The integrated circuit 900 of Embodiment 3 of the present invention adjusts, using the resistance heaters, the temperature of a core circuit, in particular the temperature of transistors on a critical path, to a suitable value in accordance with the bandwidth of the external memory MR allocated to each core circuit, as shown above. As a result, the threshold voltages of the transistors are adjusted to a suitable value; therefore it is possible to balance the operating speed and electric power consumption of the core circuit. For example, changing a viewing target from a terrestrial digital television broadcast to online video content raises the frequency of access to the external memory MR by the decoder 701. Alternatively, when the DSP 702 decodes an audio stream, the frequency of access to the external memory MR by the DSP 702 varies with the compression encoding scheme of the audio stream. With rise of the frequency of access to the external memory MR, the heater control unit 750 sends electric current to resistance heaters of both the decoder 701 and the DSP 702. By doing so, the temperature of the transistors on critical paths of the decoder 701 and the DSP 702 increases and accordingly their threshold voltages decrease and therefore their operating speeds reliably rise. On the other hand, when the frequency of access to the external memory MR reduces, the heater control unit 750 stops electric current flowing to the resistance heaters of the decoder 701 and the DSP 702. By doing so, the temperature of the transistors on critical paths decreases, and thus their threshold voltages increase. As a result, leakage current reduces, and therefore it is possible to suppress the electric power consumption of the decoder 701 and the DSP 702. In this way, the integrated circuit 900 dynamically controls the operating speeds of the core circuits to achieve both a reduction in electric power consumption and an increase in operating speeds.

Embodiment 4

Figure 16:
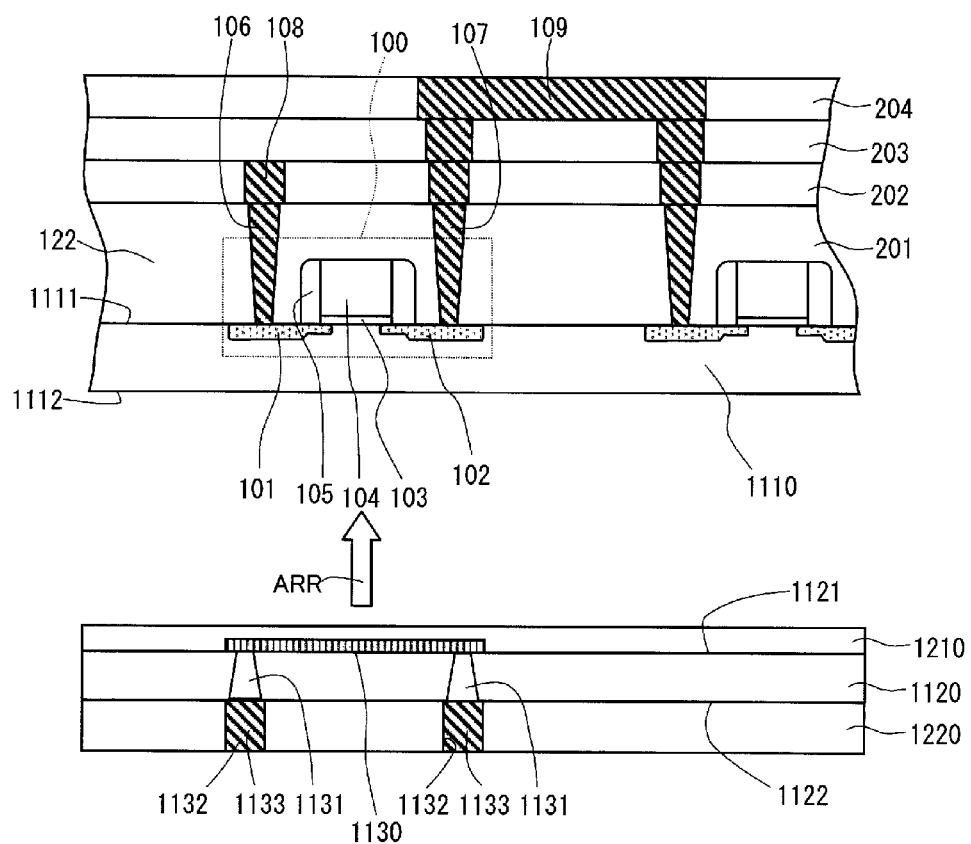
FIG. 16 is a cross-sectional diagram showing the laminated structure of transistors and their surroundings included in an integrated circuit of Embodiment 4 of the present invention.

FIG. 16 is a cross-sectional diagram showing the laminated structure of a transistor and its surroundings included in an integrated circuit of Embodiment 4 of the present invention. This structure differs from the structure of Embodiment 1 shown in FIG. 2 in that the resistance heater is formed on a different substrate from that where the transistor is formed. Other elements are similar to those of Embodiment 1, and therefore the following explanation will mainly describe the modifications from Embodiment 1. A description of the similar elements may be found in the explanation about Embodiment 1.

Referring to FIG. 16, a first substrate 1110 is stacked on top of a second substrate 1120 in the integrated circuit. The first substrate 1110 includes a first surface 1111 and second surface 1112 (the upper and lower surfaces, respectively, shown in FIG. 16) that are substantially parallel to each other. The transistor 100 is laminated to the first surface 1110 and includes a first diffusion area 101, a second diffusion area 102, a gate oxide film 103, a gate electrode 104, sidewalls 105, a first contact hole 106, a second contact hole 107, a first trace 108 and a second trace 109. These elements are similar to those shown in FIGS. 1 and 2, and therefore the detailed explanation about the elements will be found in the explanation about Embodiment 1.

Referring further to FIG. 16, the second substrate 1120 includes a third surface 1121 and fourth surface 1122 (the upper and lower surfaces, respectively, shown in FIG. 16) that are substantially parallel to each other. The third surface 1121 is bonded to the second surface 1112 of the first substrate 1110. (Refer to the arrow ARR shown in FIG. 16.) The resistance heater 1130 is laminated to the part of the third surface 1121 located underneath the transistor 100. The resistance heater 1130 is formed of polysilicon or non-dope silicon. The planar shape of the resistance heater 1130 is, like that shown in FIG. 1, a long thin rectangle extending in a direction orthogonal to the gate electrode 140. Furthermore, two resistance heaters 1130 are provided to one transistor 100. The third surface 1121 is covered with an insulating film 1210. The insulating film 1210 is formed of silicon oxide. The insulating film 1210 is sandwiched between the third surface 1121 and the second surface 1112 of the first substrate 1110, electrically isolating them from each other. One TSV 1131 is formed on the part of the second substrate 1120 facing each longitudinal end of the resistance heater 1130. The TSVs 1131 are filled with polysilicon. The fourth surface 1122 of the second substrate 1120 is covered with an interlayer insulating film 1220. Third contact holes 1132 are formed in the interlayer insulating film 1220, and the ends of the TSVs 1131 are exposed through the third contact holes 1132. Third traces 1133 are connected to the TSVs 1131 through the third contact holes 1132. The third traces 1133 are formed of aluminum or copper. When electric current flows to the resistance heater 1130 through the third traces 1133, a comparatively great Joule heat arises, since the resistance value of the resistance heater 1130 is greater than that of the third traces 1133. By doing so, it is possible to heat the transistor 100, in particular its channel area, by using the resistance heater 1130.

The resistance heaters 1130 are placed underneath those transistors 100 which belong to a critical path. This enables those transistors to be selectively heated so that their temperatures rise higher than those of other transistors. As shown in FIG. 3, generally speaking, transistors under a high temperature condition have lower threshold voltages than transistors under a low temperature condition. Accordingly, raising the temperature of transistors on a critical path higher than that of other transistors enables the transistors on the critical path to operate at faster speeds than the other transistors, even though all the transistors share a common power supply voltage. Furthermore, by allowing electric current to flow to the resistance heaters only during the time period when high speed operation is necessary, it is possible to suppress the increase of electric power consumption to the minimum requirement. In this way, by using the structure shown in FIG. 16, it is possible to dynamically adjust the transistor threshold voltages. Note that detail of the adjustment method is similar to that of Embodiment 1. Accordingly, the detailed description can be found in the explanation about Embodiment 1.

Transistor Laminating Process

FIGS. 17-19 show the laminating process of the structure shown in FIG. 16. All of the transistors included in the integrated circuit of Embodiment 4 of the present invention have been laminated with a similar process.

Figure 17A:
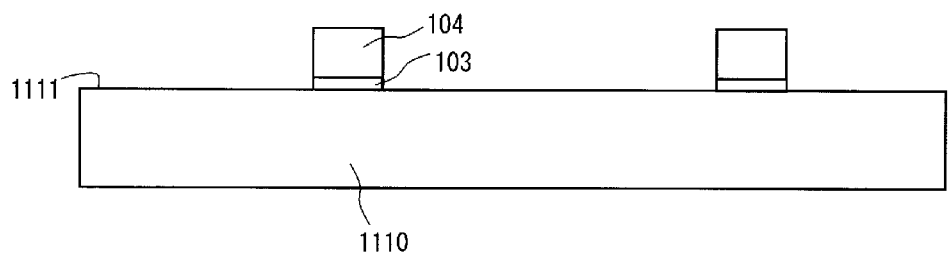
FIG. 17A is a cross-sectional diagram showing the process of laminating gate oxide films 103 and gate electrodes 104 onto a first surface 1111 of a first substrate 1110.

FIG. 17A is a cross-sectional diagram showing the process of laminating the gate oxide films 103 and gate electrodes 104 onto the first surface 1111 of the first substrate 1110. First the entirety of the first surface 1111 is thermally oxidized to be covered with a layer of silicon oxide. Next, polysilicon is accumulated on the entirety of the silicon oxide layer by LPCVD. Following that, the entirety of this polysilicon layer is coated with a photoresist and exposed to light in the pattern of the gate electrodes 104. With this, the photoresist is removed from all but the areas where the gate electrodes 104 are to be formed. Next, using the remaining photoresist as a mask, RIE is performed to remove the superfluous silicon oxide and polysilicon from the first surface 1111, and then form the gate oxide films 103 and the gate electrodes 104. Finally, the remaining photoresist is removed.

Figure 17B:
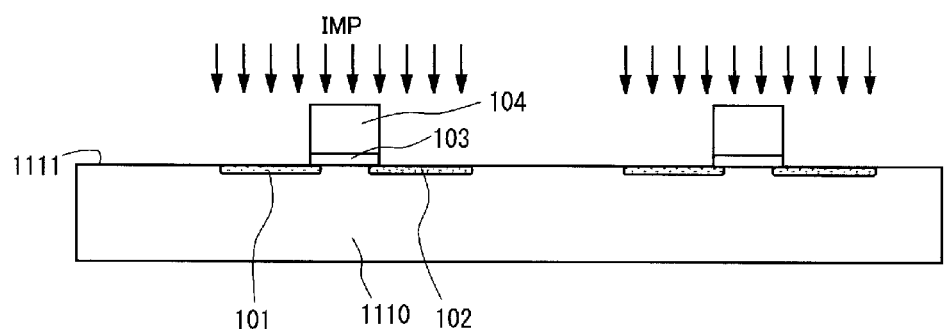
FIG. 17B is a cross-sectional diagram showing the process of forming diffusion areas.

FIG. 17B is a cross-sectional diagram showing the process of forming the diffusion areas. With this process, the gate electrodes 104 are used as a mask, and impurity ions such as boron or phosphor are infused into the first surface 1111 of the first substrate 1110. The arrows IMP shown in FIG. 17B indicate the infusion ion current. In this way, the diffusion areas 101 and 102 are thinly formed on either side of each of the gate electrodes 104.

Figure 17C:
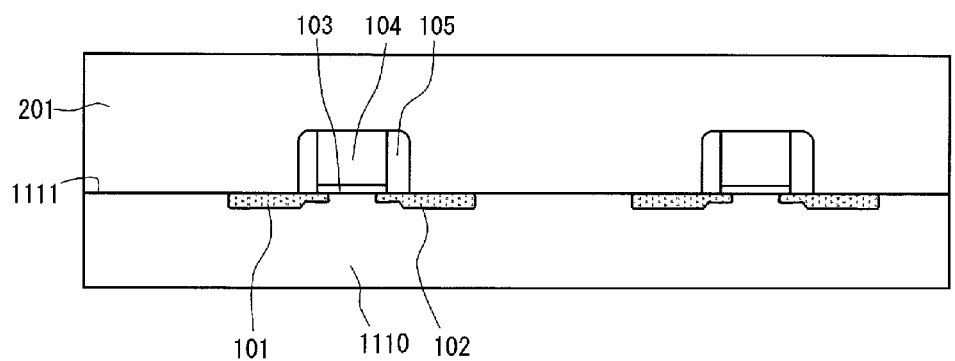
FIG. 17C is a cross-sectional diagram showing the process of forming sidewalls 105 and an interlayer insulating film 201.

FIG. 17C is a cross-sectional diagram showing the process of forming the sidewalls 105 and the interlayer insulating film 201. After the diffusion areas 101 and 102 are formed, first the entirety of the first surface 1111 of the first substrate 1110 is covered with a layer of silicon nitride by LPCVD. Next, anisotropic etching is performed so that the silicon nitride layer remains only on the sides of the gate oxide films 103 and the gate electrodes 104. By doing so, the sidewalls 105 are formed. Following that, using the gate electrodes 104 and the sidewalls 105 as a mask, impurity ions such as boron or phosphor are additionally infused into the first surface 1111. As a result, the thickness of the diffusion areas 101 and 102 increases on the outer sides of the sidewalls 105. In this way, the sidewalls 105 function as a spacer to reliably separate the diffusion areas 101 and 102 from the gate electrode 104. After the impurity ions are infused, the entirety of the first surface 1111 is covered with a silicon oxide coating to form the interlayer insulating film 201.

Figure 18A:
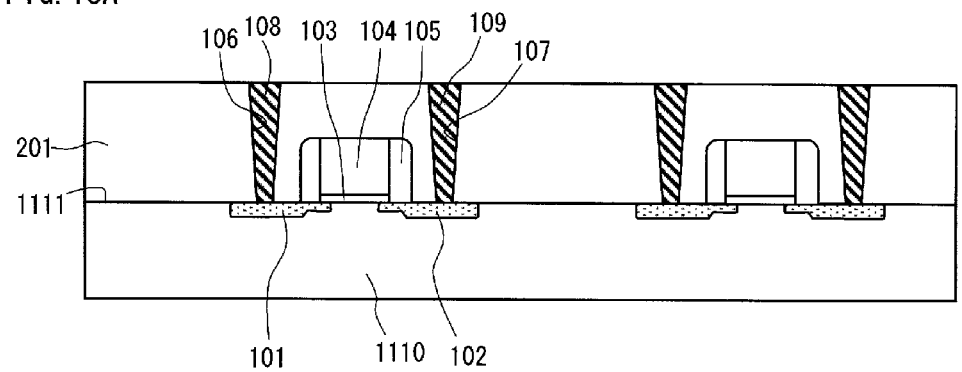
FIG. 18A is a cross-sectional diagram showing the process of forming contact holes 106, 107 and 122 in the interlayer insulating film 201.

FIG. 18A is a cross-sectional diagram showing the process of forming the contact holes 106 and 107 in the interlayer insulating film 201. First, the entirety of the interlayer insulating film 201 is covered with a photoresist, and exposed to light in the pattern of the contact holes 106 and 107. By doing so, parts of the photoresist are removed from the areas where the contact holes 106 and 107 should be formed, and then holes appear. Next, using the remaining photoresist as a mask, RIE is performed to remove parts of the interlayer insulating film 201 which are exposed through the holes of the photoresist and then deepen the holes. Following that, CVD is used to fill the insides of the holes with aluminium, tungsten, or copper. At this point, the metal will be protruding out from the upper ends of the holes. Accordingly, after the holes are filled with the metal, the surface of the interlayer insulating films 201 is polished with CMP, which removes the metal protruding from the upper ends of the holes to flatten the surface of the interlayer insulating film 201. In this way, the contact holes 106 and 107 are formed.

Figure 18B:
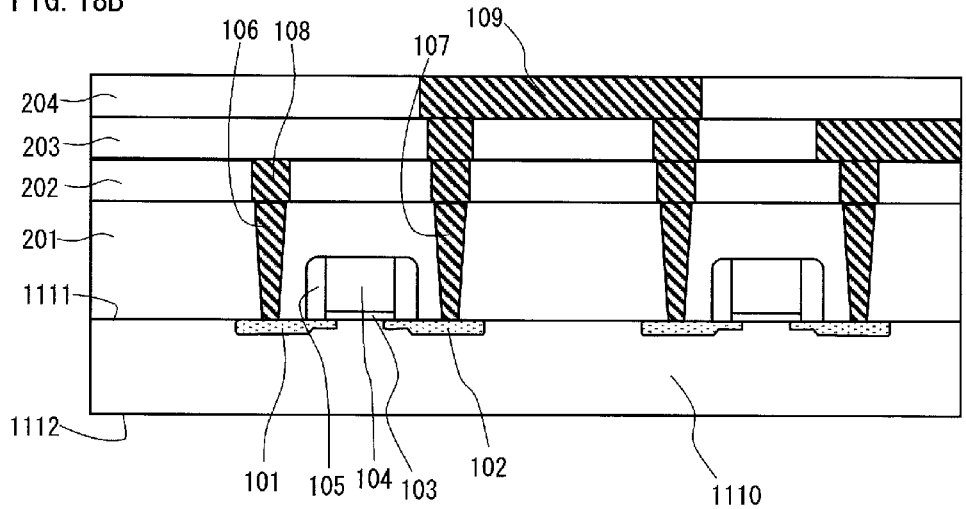
FIG. 18B is a cross-sectional diagram showing the process of forming multilayer traces 108, 109 and 123.

FIG. 18B is a cross-sectional diagram which shows the process of forming the multilayer traces 108 and 109. First, the entirety of the interlayer insulating film 201 is covered with a silicon oxide layer 202 by CVD. Next, the entirety of the silicon oxide layer 202 is covered with a photoresist, and is exposed to light in the pattern of the traces 108 and 109 as indicated by the dotted lines shown in FIG. 1. By doing so, parts of the photoresist are removed from the areas where the traces 108 and 109 should be formed, and then holes appear. Next, using the remaining photoresist as a mask, RIE is performed to remove the parts of the silicon oxide layer 202 which are exposed through the holes of the photoresist and then deepen the holes. Following that, plating or spattering is used to fill the insides of the holes with aluminium or copper. At this point, the metal will be protruding out from the upper ends of the holes. Accordingly, after the holes are filled with the metal, the surface of the silicon oxide layer 202 is polished with CMP, which removes the metal protruding from the upper ends of the holes to flatten the surface of the silicon oxide layer 202. By doing so, the traces 108 and 109 within the silicon oxide layer 202 are formed. After that, each time one of the silicon oxide layers 203 and 204 are newly laminated, a similar process is repeated. In this way, the multilayer traces shown in FIG. 18B are formed.

Figure 18C:
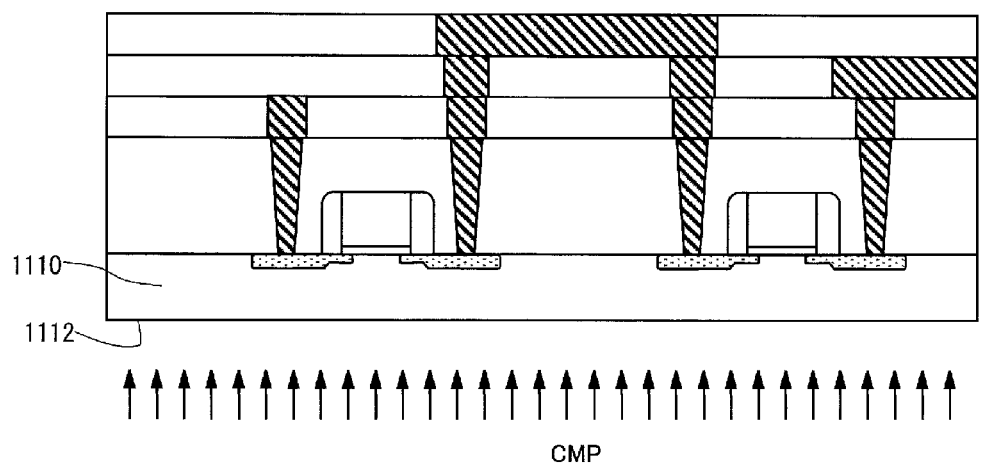
FIG. 18C is a cross-sectional diagram showing the process of polishing a second surface 1112 of the first substrate 1110.

FIG. 18C is a cross-sectional diagram showing the process of polishing the second surface 1112 of the first substrate 1110. After formation of the structure on the first surface 1111 of the first substrate 1110 as shown in FIG. 18B is completed, polishing of the second surface 1112 is carried out with CMP. The arrows CMP shown in FIG. 18C show the direction in which the thickness of the substrate 1110 changes with the CMP. The CMP is repeated several times while the roughness of the polishing is altered in several steps. With this, the thickness of the first substrate 1110 decreases to a range of several micrometers to several dozens of micrometers. At this point in time, it is desirable that the thickness of the first substrate 1110 is made to be narrower compared to the thickness of the substrate 110 shown in FIG. 6A.

Figure 19A:
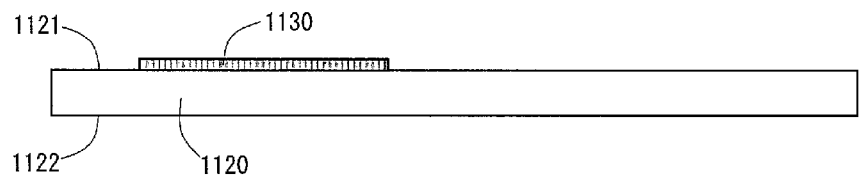
FIG. 19A is a cross-sectional diagram showing the process of forming a resistance heater 1130 on a third surface 1121 of a second substrate 1120.

FIG. 19A is a cross-sectional diagram that shows the process of forming the resistance heaters 1130 on the third surface 1121 of the second substrate 1120. First, polysilicon is accumulated on the entirety of the third surface 1121 with LPCVD. Next, the entirety of the polysilicon layer is covered with a photoresist, which is exposed to light in the pattern of the resistance heaters 1130. By doing so, the photoresist is removed from all of the polysilicon layer except where the resistance heaters 1130 should be formed. Next, using the remaining photoresist as a mask, RIE is performed to remove the superfluous polysilicon from the third surface 1121 and then form the resistance heaters 1130. Finally, the remaining photoresist is removed.

Figure 19B:
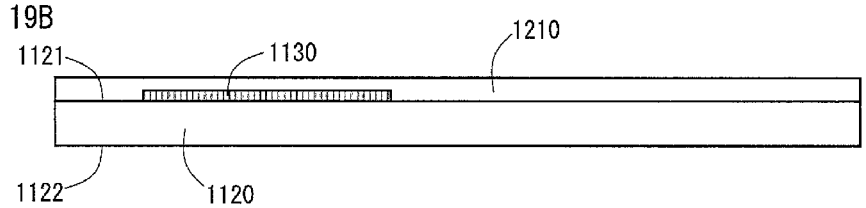
FIG. 19B is a cross-sectional diagram showing the process of forming an insulating film 1210 on the third surface 1121 of the second substrate 1120.

FIG. 19B is a cross-sectional diagram showing the process of forming the insulating films 1210 on the third surface 1121 of the second substrate 1120. After the resistance heaters 1130 are formed, silicon oxide is accumulated by CVD on the entirety of the third surface 1121 which includes the resistance heaters 1130 to form the insulating film 1210.

Figure 19C:
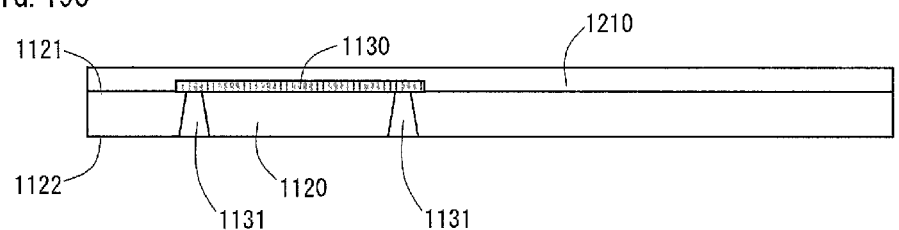
FIG. 19C is a cross-sectional diagram showing the process of forming TSVs 1131 in the second substrate 1120.

FIG. 19C is a cross-sectional diagram showing the process of forming the TSVs 1131 in the second substrate 1120. First, the fourth surface 1122 of the second substrate 1120 is covered with a photoresist which is exposed to light in the pattern of the TSVs 1131. As a result, parts of the photoresist are removed from the areas where the TSVs 1131 are to be formed, and then holes appear. Next, using the remaining photoresist as a mask, RIE is performed to remove parts of the second substrate 1120 which are exposed through the holes of the photoresist and then form vias. Following that, after the photoresist is removed from the entirety of the fourth surface 1122, an insulating film is formed by using CVD to coat the inner surfaces of the vias with silicon oxide. Subsequently, CVD is further used to fill the vias with polysilicon. At this point, polysilicon will be protruding out from the upper ends of the vias. Accordingly, after the vias are filled with polysilicon, the fourth surface 1122 is polished with CMP, which removes the polysilicon protruding from the upper ends of the vias to flatten the fourth surface 1122. In this way, the TSVs 1131 are formed.

Figure 19D:
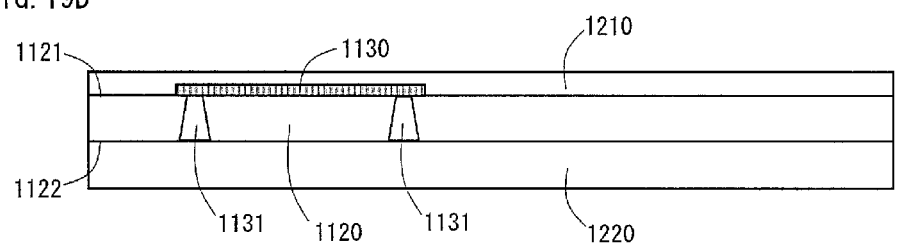
FIG. 19D is a cross-sectional diagram showing the process of forming an interlayer insulating film 1220 on a fourth surface 1122 of the second substrate 1120.

FIG. 19D is a cross-sectional diagram showing the process of forming the interlayer insulating film 1220 on the fourth surface 1122 of the second substrate 1120. After the TSVs 1131 are formed, silicon oxide is accumulated by CVD on the entirety of the fourth surface 1122 to form the interlayer insulating film 1220.

Figure 19E:
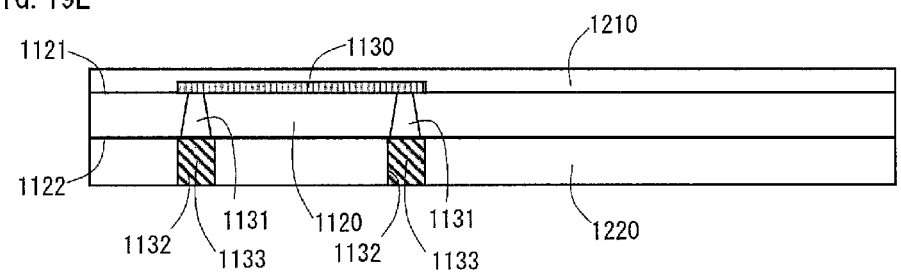
FIG. 19E is a cross-sectional diagram showing the process of forming third contact holes 1132 and third traces 1133 on the interlayer insulating film 1220.

FIG. 19E is a cross-sectional diagram showing the process of forming the third contact holes 1132 and the third traces 1133 in the interlayer insulating film 1220. First, the entirety of the interlayer insulating film 1220 is covered with a photoresist, and exposed to light in the pattern of the third contact holes 1132 and the third traces 1133. By doing so, parts of the photoresist are removed from the areas where the third contact holes 1132 and the third traces 1133 should be formed, and then holes appear. Next, using the remaining photoresist as a mask, RIE is performed to remove parts of the interlayer insulating film 1220 which are exposed through the holes of the photoresist and then deepen the holes. Following that, CVD is used to fill the insides of the holes with aluminium, tungsten, or copper. At this point, the metal will be protruding out from the upper ends of the holes. Accordingly, after the holes are filled with the metal, the surface of the interlayer insulating film 1220 is polished with CMP, which removes the polysilicon protruding from the upper ends of the holes to flatten the surface of the interlayer insulating film 1220. In this way, the third contact holes 1132 and the third traces 1133 are formed.

Embodiment 4 of the present invention differs from Embodiment 1 in that the transistors and resistance heaters are laminated to different substrates, and both the substrates are bonded together. Accordingly, the resistance heaters are laminated with a different process to that of the transistors, and thus there is no risk that the transistors are exposed to etching solution and ion current used during the process of laminating the resistance heaters. For this reason, the production method of Embodiment 4, whilst including processes more than that of Embodiment 1, can improve the reliability of the transistors.

Embodiment 5

Figure 20:
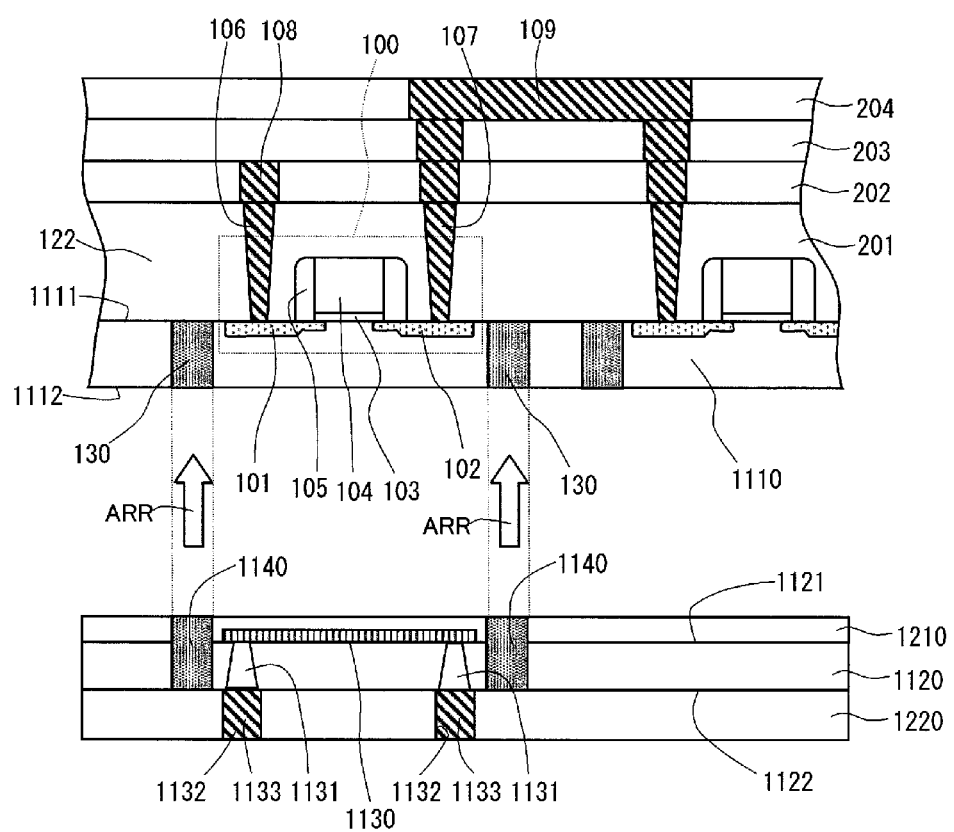
FIG. 20 is a cross-sectional diagram showing the laminated structure of transistors and their surroundings included in an integrated circuit of Embodiment 5 of the present invention.

FIG. 20 is a cross-sectional diagram showing the laminated structure of a transistor and its surrounding area included in an integrated circuit of Embodiment 5 of the present invention. This structure differs from the structure of Embodiment 4 shown in FIG. 16 in that a thermal insulator is placed around a transistor and resistance heaters. Since other elements are similar, the following will mostly describe changes from Embodiment 4. A description of the similar elements can be found in the explanation about Embodiment 4.

Referring to FIG. 20, the transistor 100 is surrounded by a first thermal insulator 130. The first thermal insulator 130 is formed on the outside of both the diffusion areas 101 and 102 in such a way as to separate the first substrate 1110. The first thermal insulator 130 is formed of material, such as silicon oxide, that has lower conductivity than silicon and aluminium, and does not pollute peripheral materials. The first thermal insulator 130 may alternatively be a region where air or nanomaterials have been trapped in the substrate 110. With the first thermal insulator 130, the area of each transistor 100 is isolated from the outside not just electrically, but thermally.

Referring further to FIG. 20, the resistance heater 1130 is surrounded by a second thermal insulator 1140. The second thermal insulator 1140 is formed between the resistance heater 1130 and its surrounding areas in such a way as to separate the second substrate 1120. The second thermal insulator 1140 is formed of material, such as silicon oxide, that has lower conductivity than silicon and aluminium, and does not pollute peripheral materials. The thermal insulator 1140 may alternatively be a region where air or nanomaterials have been trapped in the second substrate 1120. With the first substrate 1110 and second substrate 1120 being bonded together, the first thermal insulator 130 and second thermal insulator 1140 are connected to each other. Joule heat produced by the resistance heater 1130 is blocked by the first thermal insulator 130 and second insulator 1140, and thus hardly propagates to the outside. Accordingly, it is possible to further improve the efficiency in selectively raising the temperature of the transistor 100 by using the resistance heater 1130.

Transistor Laminating Process

The laminating process of the structure shown in FIG. 20 is shown in FIGS. 21-23. All transistors included in the integrated circuit of Embodiment 5 of the present invention have been laminated with a similar process. The process shown in FIGS. 21-23 differs from the process shown in FIGS. 17-19 in that a step of forming thermal insulators is included. Other steps are similar.

Figure 21A:
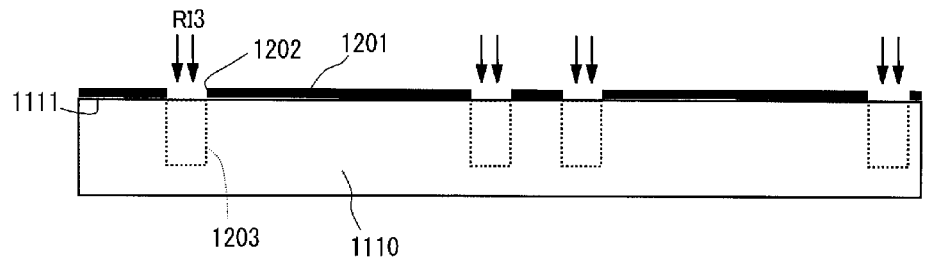
FIG. 21A is a cross-sectional diagram showing the process of forming first thermal insulators 130 in a first substrate 1110.

FIG. 21A is a cross-sectional diagram showing the process of forming the first thermal insulators 130 in the first substrate 1110. First, the first surface 1111 of the first substrate 1110 is covered with a photoresist 1201 and exposed to light in the pattern of the first thermal insulators 130. Then, parts of the photoresist 1201 are removed from the areas where the first thermal insulators 130 are to be formed, and thus holes 1202 appear. Next, using the remaining photoresist 1201 as a mask, RIE is performed to remove the parts of the first substrate 1110 which are exposed through the holes 1202 in the photoresist and then form trench-shaped vias 1203 (see the dotted line sections of FIG. 21A). The arrows RI3 show in FIG. 21A indicate ion current used in the RIE. Subsequently, after the photoresist 1201 are removed from the entirety of the first surface 1111, the insides of the vias 1203 are filled with silicon oxide by CVD. At this point, silicon oxide will be protruding out of the upper ends of the vias 1203. Accordingly, after the vias 1203 are filled with silicon oxide, the first surface 1111 is polished with CMP, which removes the silicon oxide protruding from the upper ends of the vias 1203 and to flatten the first surface 1111. In this way, the first thermal insulators 130 are formed.

Figure 21B:
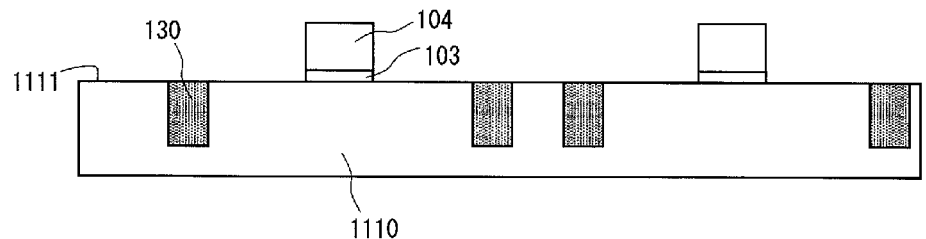
FIG. 21B is a cross-sectional diagram showing the process of laminating gate oxide films 103 and gate electrodes 104 onto the first surface 1111 of the first substrate 1110.

FIG. 21B is a cross-sectional diagram showing the process of laminating the gate oxide films 103 and gate electrodes 104 onto the first surface 1111 of the first substrate 1110. The process shown in FIG. 21B is similar to that shown in FIG. 17A. After the first thermal insulators 130 are formed, first the entirety of the first surface 1111 is thermally oxidized to be covered with a layer of silicon oxide. Next, polysilicon is accumulated on the entirety of the silicon oxide layer by LPCVD. Following that, the entirety of this polysilicon layer is coated with a photoresist and exposed to light in the pattern of the gate electrodes 104, and thus the photoresist is removed from all but the areas where the gate electrodes 104 are to be formed. Furthermore, using the remaining photoresist as a mask, RIE is performed to remove the superfluous silicon oxide and polysilicon from the first surface 1111, and then form the gate oxide films 103 and the gate electrodes 104. Finally, the remaining photoresist is removed.

Figure 21C:
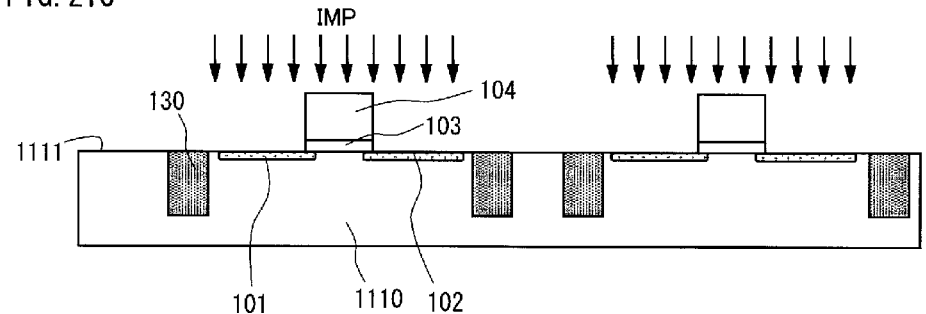
FIG. 21C is a cross-sectional diagram showing the process of forming diffusion areas.

FIG. 21C is a cross-sectional diagram showing the process of forming the diffusion areas. The process shown in FIG. 21C is similar to that shown in FIG. 17B. With this process, the gate electrodes 104 are used as a mask, and impurity ions such as boron or phosphor are infused into the first surface 1111 of the first substrate 1110, and then the diffusion areas 101 and 102 are thinly formed on either side of each of the gate electrodes 104.

Figure 21D:
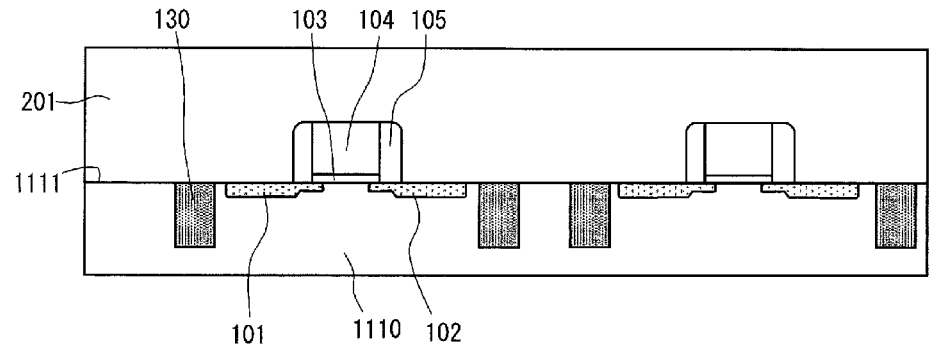
FIG. 21D is a cross-sectional diagram showing the process of forming sidewalls 105 and an interlayer insulating film 201.

FIG. 21D is a cross-sectional diagram showing the process of forming the sidewalls 105 and the interlayer insulating film 201. The process shown in FIG. 21D is similar to that shown in FIG. 17C. After the diffusion areas 101 and 102 are formed, first the entirety of the first surface 1111 of the first substrate 1110 is covered with a layer of silicon nitride by LPCVD. Next, anisotropic etching is performed so that the silicon nitride layer remains only on the sides of the gate oxide films 103 and the gate electrodes 104. By doing so, the sidewalls 105 are formed. Following that, using the gate electrodes 104 and the sidewalls 105 as a mask, impurity ions such as boron or phosphor are additionally infused into the first surface 1111. As a result, the thickness of the diffusion areas 101 and 102 increases on the outer sides of the sidewalls 105. After the impurity ions are infused, the entirety of the first surface 1111 is covered with a silicon oxide coating to form the interlayer insulating film 201.

Figure 22A:
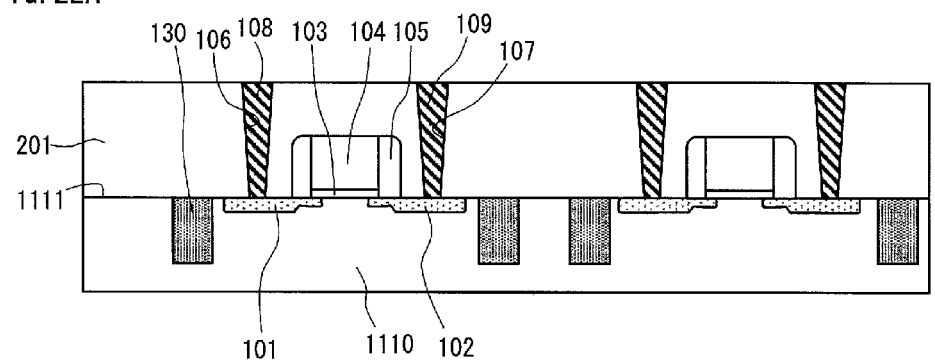
FIG. 22A is a cross-sectional diagram showing the process of forming contact holes 106, 107 and 122 in the interlayer insulating film 201.

FIG. 22A is a cross-sectional diagram showing the process of forming the contact holes 106 and 107 in the interlayer insulating film 201. The process shown in FIG. 22A is similar to that shown in FIG. 18A. First, the entirety of the interlayer insulating film 201 is covered with a photoresist, and exposed to light in the pattern of the contact holes 106 and 107, and then holes are formed. Next, using the remaining photoresist as a mask, RIE is performed to remove parts of the interlayer insulating film 201 which are exposed through the holes of the photoresist and then deepen the holes. Following that, CVD is used to fill the insides of the holes with aluminium, tungsten, or copper. Subsequently, the surface of the interlayer insulating film 201 is polished with CMP, which removes the polysilicon protruding from the upper ends of the holes to flatten the surface of the interlayer insulating film 201. In this way, the contact holes 106 and 107 are formed.

Figure 22B:
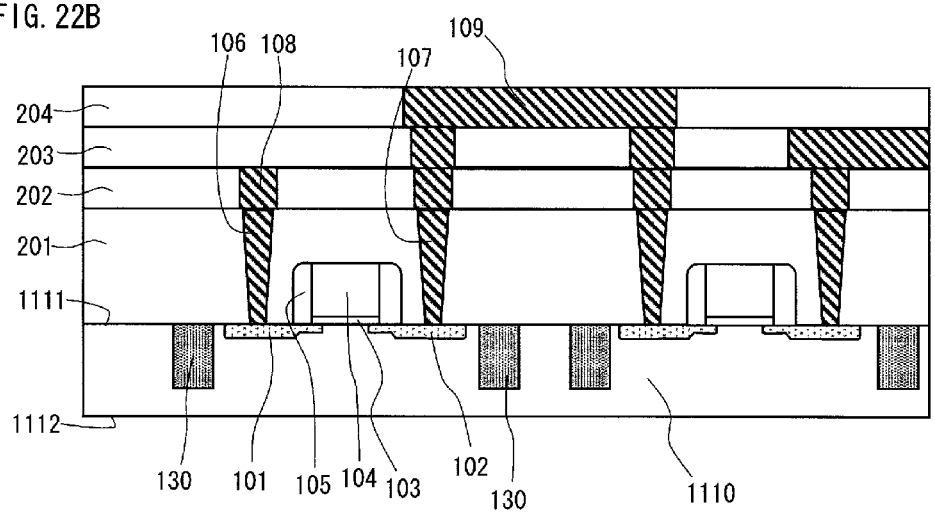
FIG. 22B is a cross-sectional diagram showing the process of forming multilayer traces 108, 109 and 123.

FIG. 22B is a cross-sectional diagram which shows the process of forming the multilayer traces 108 and 109. The process shown in FIG. 22B is similar to that shown in FIG. 18B. First, the entirety of the interlayer insulating film 201 is covered with a silicon oxide layer 202 by CVD. Next, the entirety of the silicon oxide layer 202 is covered with a photoresist, and is exposed to light in the pattern of the traces 108 and 109 as indicated by the dotted lines shown in FIG. 1, and then holes are formed. Next, using the remaining photoresist as a mask, RIE is performed to remove the parts of the silicon oxide layer 202 which are exposed through the holes of the photoresist and then deepen the holes. Following that, plating or spattering is used to fill the insides of the holes with aluminium or copper. Subsequently, the surface of the silicon oxide layer 202 is polished with CMP, which removes the metal protruding from the upper ends of the holes to flatten the surface of the silicon oxide layer 202. By doing so, the traces 108 and 109 within the silicon oxide layer 202 are formed. After that, each time one of the silicon oxide layers 203 and 204 are laminated, a similar process is repeated. In this way, the multilayer traces shown in FIG. 22B are formed.

Figure 22C:
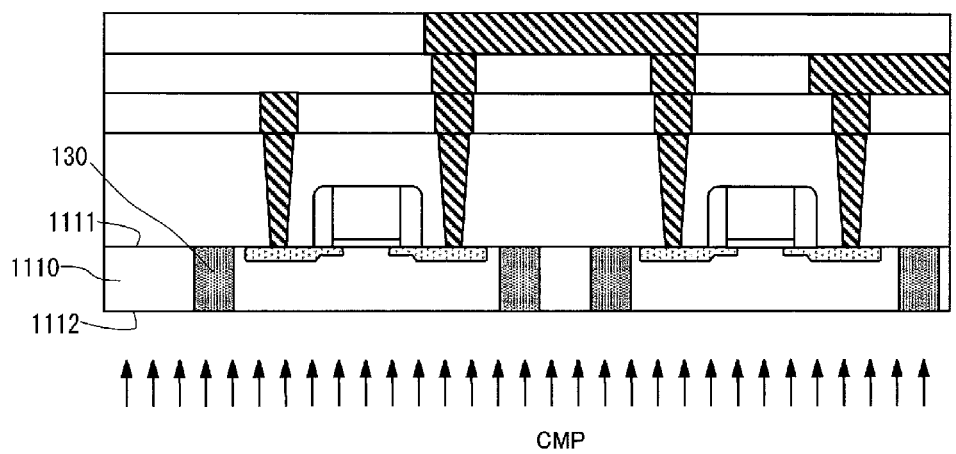
FIG. 22C is a cross-sectional diagram showing the process of polishing the second surface 1112 of the first substrate 1110.

FIG. 22C is a cross-sectional diagram showing the process of polishing the second surface 1112 of the first substrate 1110. The process shown in FIG. 22C is similar to that shown in FIG. 18C. After formation of the structure of the first surface 1111 of the first substrate 1110 shown in FIG. 22B is completed, polishing of the second surface 1112 is carried out with CMP. With this, the thickness of the first substrate 1110 decreases to a range of several micrometers to several dozens of micrometers. As a result, the first thermal insulators 130 are exposed at the second surface 1112 as shown in FIG. 22C. At this point in time, it is desired that the thickness of the first substrate 1110 is made to be narrower compared to the thickness of the substrate 110 shown in FIG. 13A.

Figure 23A:
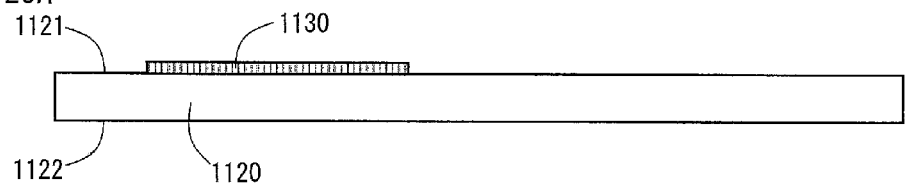
FIG. 23A is a cross-sectional diagram showing the process of forming a resistance heater 1130 on a third surface 1121 of a second substrate 1120.

FIG. 23A is a cross-sectional diagram that shows the process of forming the resistance heaters 1130 on the third surface 1121 of the second substrate 1120. The process shown in FIG. 23A is similar to that shown in FIG. 19A. First, polysilicon is accumulated on the entirety of the third surface 1121 with LPCVD. Next, the entirety of the polysilicon layer is covered with a photoresist, which is exposed to light in the pattern of the resistance heaters 1130 and thus photoresist is removed from all of the polysilicon layer except where the resistance heaters 1130 should be formed. Next, using the remaining photoresist as a mask, RIE is performed to remove the superfluous polysilicon from the third surface 1121 and then form the resistance heaters 1130. Finally, the remaining photoresist is removed.

Figure 23B:
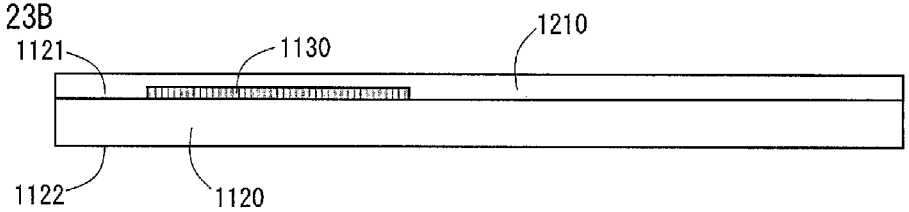
FIG. 23B is a cross-sectional diagram showing the process of forming an insulating film 1210 on the third surface 1121 of the second substrate 1120.

FIG. 23B is a cross-sectional diagram showing the process of forming the insulating film 1210 on the third surface 1121 of the second substrate 1120. The process shown in FIG. 23B is similar to that shown in FIG. 19B. After the resistance heaters 1130 are formed, silicon oxide is accumulated by CVD on the entirety of the third surface 1121 which includes the resistance heaters 1130 to form the insulating film 1210.

Figure 23C:
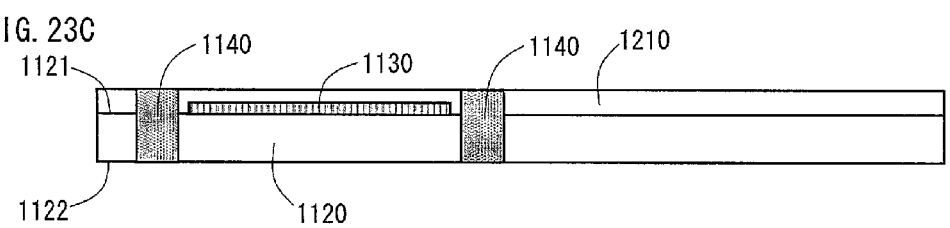
FIG. 23C is a cross-sectional diagram showing the process of forming second thermal insulators 1140 in the second substrate 1120.

FIG. 23C is a cross-sectional diagram showing the process of forming the second thermal insulator 1140 in the second substrate 1120. First, the entirety of the insulating film 1210 is covered with a photoresist and exposed to light in the pattern of the second thermal insulator 1140. By doing so, a part of the photoresist is removed from the area where the second thermal insulator 1140 should be formed, and then a hole appears. Next, using the remaining photoresist as a mask, RIE is performed to remove the parts of both the insulating film 1210 and second substrate 1120 which are exposed through the holes of the photoresist and then form a trench-shaped via. Subsequently, after the photoresist is removed from the entirety of the insulating layer 1210, the inside of the via is filled with silicon oxide by CVD. At this point, silicon oxide will be protruding out of the upper end of the via. Accordingly, after the via is filled with silicon oxide, the surface of the insulating layer 1210 is polished with CMP, which removes the silicon oxide protruding from the upper end of the via to flatten the surface of the insulating layer 1210. In this way, the second thermal insulator 1140 is formed.

Figure 23D:
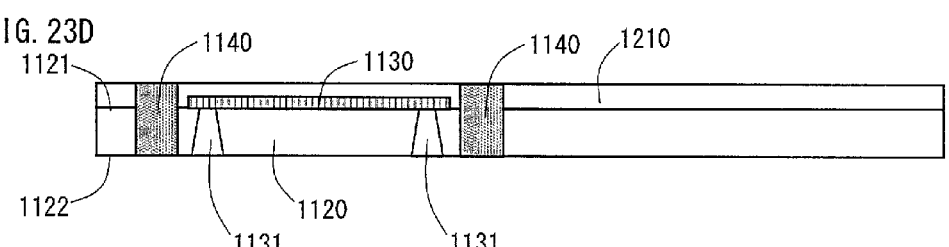
FIG. 23D is a cross-sectional diagram showing the process of forming TSVs 1131 in the second substrate 1120.

FIG. 23D is a cross-sectional diagram showing the process of forming the TSVs 1131 in the second substrate 1120. The process shown in FIG. 23D is similar to that shown in FIG. 19C. First, the fourth surface 1122 of the second substrate 1120 is covered with a photoresist which is exposed to light in the pattern of the TSVs 1131, and then holes are formed. Next, using the remaining photoresist as a mask, RIE is performed to remove the parts of the second substrate 1120 which are exposed through the holes of the photoresist and then form vias. Following that, after the photoresist is removed from the entirety of the fourth surface 1122, an insulating films is formed by using CVD to coat the inner surfaces of the vias with silicon oxide. Subsequently, CVD is further used to fill the vias with polysilicon. After that, the fourth surface 1122 is polished with CMP, which removes the polysilicon protruding from the upper end of the via to flatten the fourth surface 1122. In this way, the TSVs 1131 are formed.

Figure 23E:
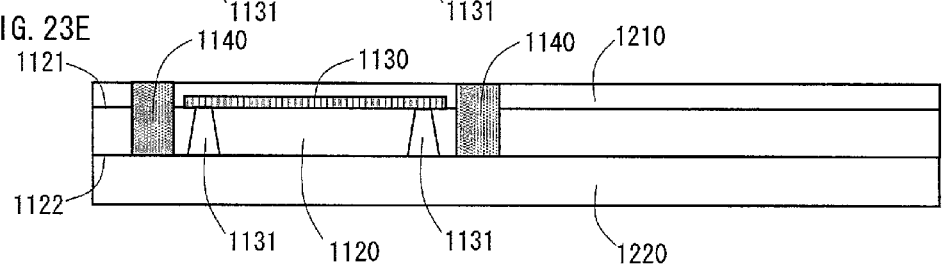
FIG. 23E is a cross-sectional diagram showing the process of forming an interlayer insulating film 1220 on a fourth surface 1122 of the second substrate 1120.

FIG. 23E is a cross-sectional diagram showing the process of forming the interlayer insulating films 1220 on the fourth surface 1122 of the second substrate 1120. The process shown in FIG. 23E is similar to that shown in FIG. 19D. After the TSVs 1131 are formed, silicon oxide is accumulated by CVD on the entirety of the fourth surface 1122 to form the interlayer insulating film 1220.

Figure 23F:
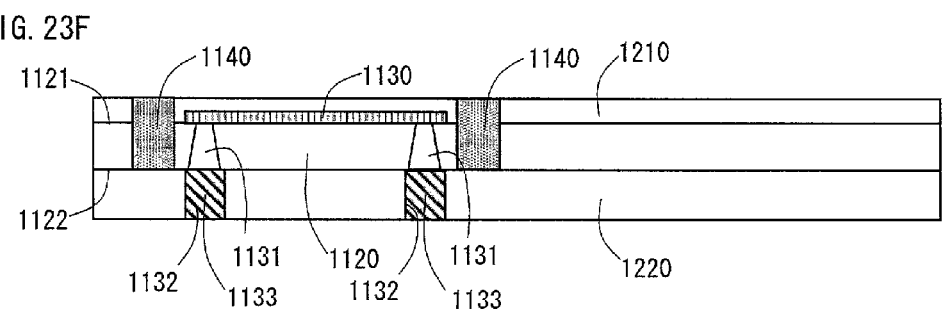
FIG. 23F is a cross-sectional diagram showing the process of forming contact holes 1132 and third traces 1133 in the interlayer insulating film 1220.

FIG. 23F is a cross-sectional diagram showing the process of forming the third contact holes 1132 and the third traces 1133 in the interlayer insulating film 1220. The process shown in FIG. 23F is similar to that shown in FIG. 19E. First, the entirety of the interlayer insulating film 1220 is covered with a photoresist, and exposed to light in the pattern of the third contact holes 1132 and the third traces 1133, and then holes are formed. Next, using the remaining photoresist as a mask, RIE is performed to remove the parts of the interlayer insulating film 1220 which are exposed through the holes of the photoresist and then deepen the holes. Following that, CVD is used to fill the insides of the holes with aluminium, tungsten, or copper. Subsequently, the surface of the interlayer insulating film 1220 is polished with CMP, which removes the metal protruding from the upper ends of the holes to flatten the surface of the interlayer insulating film 1220. In this way, the third contact holes 1132 and the third traces 1133 are formed.

Modifications

In the structures shown in FIGS. 1, 2, 9, 10, 16 and 20, the individual transistors are equipped with the resistance heaters. Alternatively, a plurality of transistors may share a resistance heater. In the structures shown in FIGS. 9, 10 and 20, the thermal insulators surround the individual transistors. Alternatively, a block comprising a plurality of transistors, or the entirety of a critical path may be surrounded by a connecting thermal insulator.

In the structures shown in FIGS. 1, 2, 9, 10, 16 and 20, the transistors are a MOS transistor. Alternatively, the transistors may be a bipolar transistor. As shown in FIG. 3, the control of the present invention may be applied to any transistor that has the characteristic of lowering its threshold voltage with a rise in temperature.

The temperature detection unit 760 shown in FIGS. 7 and 14 detects the temperature of each core circuit or its surrounding area. Alternatively, the temperature detection unit 760 may detect only the temperature of a single part of the integrated circuit 700 or 900. In this case, the temperature monitoring unit 754 may estimate the temperature of each core circuit from the temperature of the single part detected by the temperature detection unit 760 and the distance between the single part and each core circuit.

INDUSTRIAL APPLICABILITY

The present invention relates to technology for controlling operation speeds of semiconductor integrated circuits, and as described above, places resistance heaters across a substrate from transistors to adjust the temperature of the transistors and thus controls the threshold voltages of the transistors. The present invention therefore clearly demonstrates industrial applicability.

REFERENCE SIGNS LIST

100 Transistor
101 First diffusion area
102 Second diffusion area
103 Gate oxide film
104 Gate electrode
105 Sidewall
106 First contact hole
107 Second contact hole
108 First trace
109 Second trace
110 Substrate
111 First surface
112 Second surface
120 Resistance heater
122 Third contact hole
123 Third trace
201-204 Interlayer insulating film
205 Insulating film

The invention claimed is:

1. An integrated circuit comprising:
   a substrate including a first surface and a second surface that are substantially parallel to each other;
   a plurality of transistors, each of the plurality of transistors including
      an electrode laminated onto the first surface, and
      two diffusion areas disposed within the substrate in the vicinity of the electrode;
   a plurality of resistance heaters laminated at least one onto a different area of the second surface alone, the different area of the second surface being located across the substrate from the electrode included in a different one of the plurality of transistors, each of the plurality of resistance heaters being configured to produce heat by allowing electric current to flow; and
   a plurality of switches, each of the plurality of switches (i) connecting a different one of the plurality of resistance heaters with a current source and (ii) being configured to allow or prevent flow of electric current between the different one of the plurality of the resistance heaters and the current source, thereby allowing the plurality of resistance heaters to selectively heat the plurality of transistors to raise a temperature of a selected one of the plurality of transistors to a first temperature higher than a second temperature of others of the plurality of transistors.

2. The integrated circuit of claim 1, further comprising a thermal insulator located within the substrate and surrounding the two diffusion areas to prevent external leakage of heat from the two diffusion areas.

3. The integrated circuit of claim 1, wherein the plurality of transistors including one transistor belonging to a critical path of the integrated circuit, and the plurality of resistance heaters raise a temperature of the one transistor to the first temperature higher than the second temperature of the others of the plurality of transistors.

4. The integrated circuit of claim 1, wherein operating speeds of the plurality of transistors rise due to the plurality of resistance heaters heating the plurality of transistors.

5. The integrated circuit of claim 4, wherein the plurality of transistors are MOS transistors.

6. The integrated circuit of claim 1, further comprising a heater control circuit located on the substrate and including the current source configured to supply electric current to the plurality of resistance heaters, the heater control circuit configured to selectively adjust amounts of electric current flowing between the current source and the plurality of resistance heaters.

7. The integrated circuit of claim 6, wherein the heater control circuit selectively controls the plurality of switches to adjust the amounts of electric current supplied to the plurality of resistance heaters.

8. The integrated circuit of claim 6, wherein the heater control circuit allows electric current to flow to a specific one of the plurality of resistance heaters only during operation of a corresponding one of the plurality of transistors, the specific one of the resistance heaters is laminated onto an area of the second surface located across the substrate from the electrode included in the corresponding one of the plurality of transistors, and the specific one of the plurality of resistance heaters heats the corresponding one of the plurality of transistors to raise a temperature of the corresponding one of the plurality of transistors to the first temperature higher than the second temperature of the others of the plurality of transistors.

9. The integrated circuit of claim 6, wherein the heater control circuit alters the amount of electric current supplied to the plurality of resistance heaters in accordance with a use case of the integrated circuit.

10. The integrated circuit of claim 6, wherein the heater control circuit adjusts the amount of electric current supplied to the plurality of resistance heaters according to bandwidth of an external memory connected to the integrated circuit.

11. The integrated circuit of claim 6, further comprising a temperature detection circuit configured to detect a temperature of an area surrounding the plurality of transistors, wherein the heater control circuit adjusts a length of a period of time during which electric current is allowed to flow continuously to the plurality of resistance heaters according to the temperature detected by the temperature detection circuit.

12. The integrated circuit of claim 6, further comprising a temperature detection circuit configured to detect a temperature of an area surrounding the plurality of transistors, wherein the heater control circuit adjusts the amounts of electric current allowed to flow to the plurality of resistance heaters according to the temperature detected by the temperature detection circuit.

13. An integrated circuit comprising:
a first substrate including a first surface and second surface that are substantially parallel to each other;
a plurality of transistors, each of the plurality of transistors including
an electrode laminated onto the first surface, and
two diffusion areas disposed within the first substrate in the vicinity of the electrode;
a second substrate bonded to the second surface;
a plurality of resistance heaters laminated at least one onto a different area of the second substrate opposite to a different area of the second surface alone, the second substrate being bonded to the second surface, the different area of the second surface being located across the first substrate from the electrode included in a different one of the plurality of transistors, each of the plurality of resistance heaters being configured to produce heat by allowing electric current to flow; and
a plurality of switches, each of the plurality of switches (i) connecting a different one of the plurality of resistance heaters with a current source and (ii) being configured to allow or prevent flow of electric current between the different one of the plurality of the resistance heaters and the current source, thereby allowing the plurality of resistance heaters to selectively heat the plurality of transistors to raise a temperature of a selected one of the plurality of transistors to a first temperature higher than a second temperature of others of the plurality of transistors.

14. The integrated circuit of claim 13, further comprising a thermal insulator surrounding the two diffusion areas within the first substrate to prevent external leakage of heat from the two diffusion areas.

15. The integrated circuit of claim 13, wherein the plurality of transistors include one transistor belonging to a critical path of the integrated circuit, and the plurality of resistance heaters raise a temperature of the one transistor to the first temperature higher than the second temperature of the others of the plurality of transistors.

16. The integrated circuit of claim 13, wherein operating speeds of the plurality of transistors rise due to the plurality of resistance heaters heating the plurality of transistors.

17. The integrated circuit of claim 16, wherein the plurality of transistors are MOS transistors.

18. The integrated circuit of claim 13, further comprising a heater control circuit located on one of the first substrate and the second substrate and including the current source configured to supply electric current to the plurality of resistance heaters, the heater control circuit configured to selectively adjust amounts of electric current flowing between the current source and the plurality of resistance heaters.

19. The integrated circuit of claim 18, wherein the heater control circuit selectively controls the plurality of switches to adjust the amounts of electric current supplied to the plurality of resistance heaters.

20. The integrated circuit of claim 18, wherein
the heater control circuit allows electric current to flow to a specific one of the plurality of resistance heaters only during operation of a corresponding one of the plurality of transistors,
the specific one of the plurality of resistance heaters is laminated onto an area of the second substrate opposite to an area of the second surface located across the first substrate from the electrode included in the corresponding one of the plurality of transistors, and
the specific one of the plurality of resistance heaters heats the corresponding one of the plurality of transistors to raise a temperature of the corresponding one of the plurality of transistors to the first temperature higher than the second temperature of the others of the plurality of transistors.

21. The integrated circuit of claim 18, wherein
the heater control circuit alters the amounts of electric current supplied to the plurality of resistance heaters in accordance with a use case of the integrated circuit.

22. The integrated circuit of claim 18, wherein
the heater control circuit adjusts the amounts of electric current supplied to the plurality of resistance heaters according to bandwidth of an external memory connected to the integrated circuit.

23. The integrated circuit of claim 18, further comprising
a temperature detection circuit configured to detect the temperature of an area surrounding the plurality of transistors, wherein
the heater control circuit adjusts a length of the period of time during which electric current is allowed to flow continuously to the plurality of resistance heaters according to the temperature detected by the temperature detection circuit.

24. The integrated circuit of claim 18, further comprising
a temperature detection circuit configured to detect a temperature of an area surrounding the plurality of transistors, wherein
the heater control circuit adjusts the amounts of electric current allowed to flow continuously to the plurality of resistance heaters according to the temperature detected by the temperature detection circuit.

* * * * *